United States Patent
Kojima et al.

(10) Patent No.: US 11,852,665 B2
(45) Date of Patent: Dec. 26, 2023

(54) PULSED HIGH FREQUENCY MONITOR

(71) Applicant: KYOSAN ELECTRIC MFG. CO., LTD., Yokohama (JP)

(72) Inventors: Hiroyuki Kojima, Yokohama (JP); Ryota Suzuki, Yokohama (JP)

(73) Assignee: KYOSAN ELECTRIC MFG. CO., LTD., Yokohama (JP)

( * ) Notice: Subject to any disclaimer, the term of this patent is extended or adjusted under 35 U.S.C. 154(b) by 118 days.

(21) Appl. No.: 17/629,154

(22) PCT Filed: Aug. 5, 2020

(86) PCT No.: PCT/JP2020/030066
§ 371 (c)(1),
(2) Date: Jan. 21, 2022

(87) PCT Pub. No.: WO2021/025076
PCT Pub. Date: Feb. 11, 2021

(65) Prior Publication Data
US 2022/0276289 A1    Sep. 1, 2022

(30) Foreign Application Priority Data
Aug. 6, 2019  (JP) ................. 2019-144918

(51) Int. Cl.
*G01R 23/02* (2006.01)
*G01R 21/00* (2006.01)

(52) U.S. Cl.
CPC ............ *G01R 23/02* (2013.01); *G01R 21/00* (2013.01)

(58) Field of Classification Search
CPC ........ G01R 23/02; G01R 21/00; G01R 21/06; H03K 3/53; H03K 5/007; H01J 37/32174;
(Continued)

(56) References Cited

U.S. PATENT DOCUMENTS

| | | | |
|---|---|---|---|
| 4,939,750 A | 7/1990 | Nakamura | |
| 2014/0232371 A1* | 8/2014 | Yang | G01R 23/10 324/76.47 |

(Continued)

FOREIGN PATENT DOCUMENTS

| | | | |
|---|---|---|---|
| JP | 64-81197 A | 3/1989 | |
| JP | 1-236747 A | 9/1989 | |

(Continued)

OTHER PUBLICATIONS

International Search Report dated Nov. 10, 2020, issued in counterpart International Application No. PCT/JP2020/030066. (2 pages).

(Continued)

*Primary Examiner* — Christopher P McAndrew
*Assistant Examiner* — Zannatul Ferdous
(74) *Attorney, Agent, or Firm* — WHDA, LLP

(57) ABSTRACT

A pulsed high frequency monitor of the present invention monitors the power level of a pulsed high frequency on the basis of a transition pattern in which the power level changes in time series instead of monitoring the power level by comparing the power level of the pulsed high frequency with a threshold value. The pulsed high frequency monitor comprises: a DC circuit that converts the pulsed high frequency into DC and outputs the power level; a power level change detection circuit that detects a level change of the power level; and a transition pattern determination circuit that determines a time-series transition pattern of the power level on the basis of the level change detected by the power level change detection circuit.

8 Claims, 23 Drawing Sheets

(58) Field of Classification Search
CPC ........... H01J 37/32935; H01J 37/32146; H01J 37/32293; H04L 25/03; H04L 25/06; H04L 25/069; H04L 25/03012
See application file for complete search history.

(56) References Cited

U.S. PATENT DOCUMENTS

| | | | |
|---|---|---|---|
| 2014/0361690 A1* | 12/2014 | Yamada | C23C 16/515 315/111.21 |
| 2015/0333708 A1* | 11/2015 | Yuzurihara | H03F 1/308 330/251 |
| 2017/0103871 A1* | 4/2017 | An | G01R 29/02 |
| 2019/0148112 A1 | 5/2019 | Kaneko et al. | |
| 2019/0206656 A1* | 7/2019 | Diener | H02M 7/48 |

FOREIGN PATENT DOCUMENTS

| | | |
|---|---|---|
| JP | 2006-170816 A | 6/2006 |
| JP | 2011-151576 A | 8/2011 |
| JP | 2013-5538 A | 1/2013 |
| JP | 2013-21438 A | 1/2013 |
| KR | 10-2014-0103716 A | 8/2014 |
| KR | 10-2015-0072785 A | 6/2015 |
| KR | 10-2019-0053793 A | 5/2019 |

OTHER PUBLICATIONS

Extended European Search Report dated Jul. 7, 2023, issued in counterpart European application No. 20850576.8 (7 pages).
Office Action dated May 15, 2023, issued in counterpart KR application No. 10-2022-7001277, with English translation. (11 pages).

* cited by examiner

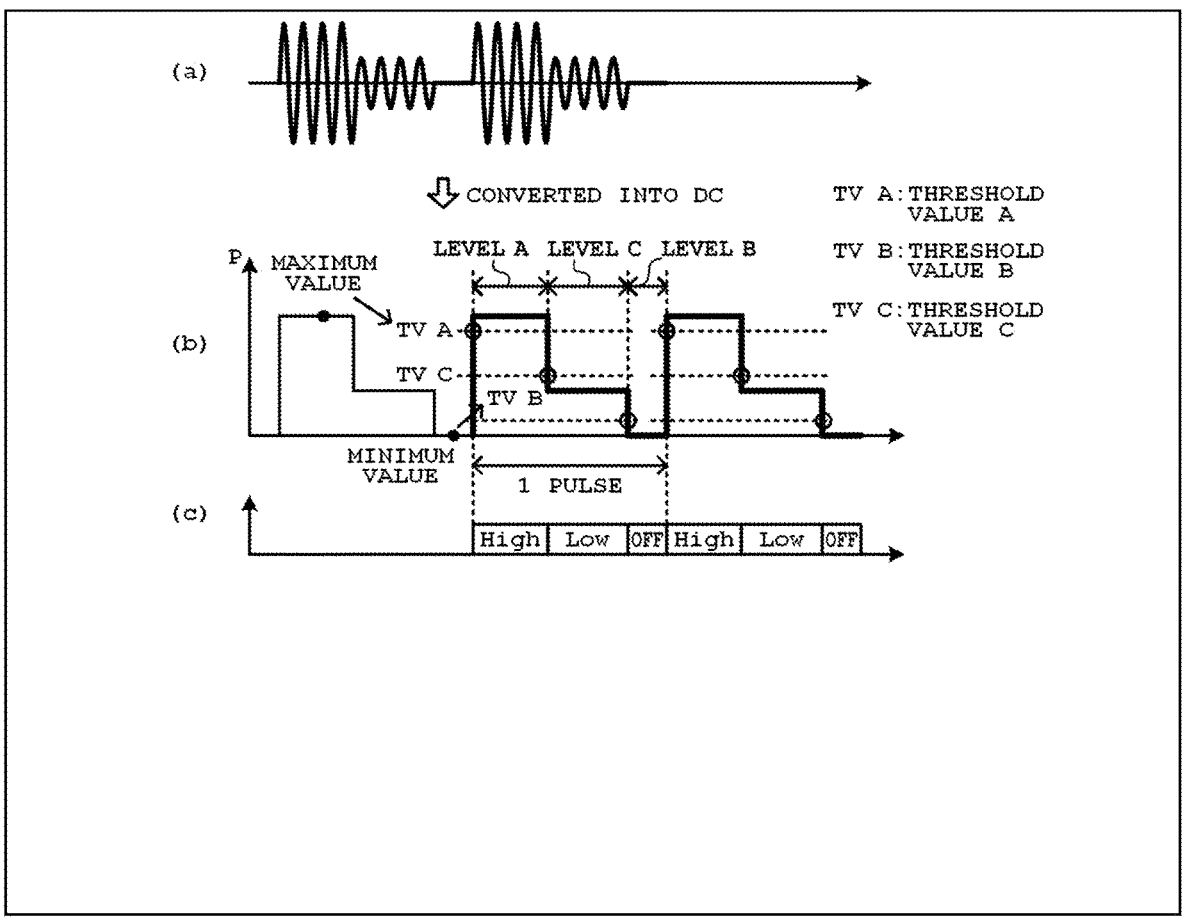

PULSED HIGH FREQUENCY MONITOR

TECHNICAL FIELD

The present invention relates to a pulsed high frequency monitor for monitoring a pulsed high frequency.

BACKGROUND ART

An apparatus using a high frequency, such as semiconductor manufacturing apparatus, liquid crystal panel manufacturing apparatus and similar, is supplied with high-frequency power of a pulsed high frequency from a high-frequency power supply device. The pulsed high frequency is a high-frequency signal having intermittent pulsed high frequencies obtained by making continuous high frequencies in several cycles as one pulse. The process of obtaining a pulsed high frequency is called as pulsing, and a pulsed high frequency is also called as pulsed RF.

FIGS. 22(a) to 22(f) show examples of typical pulsed high frequencies. As to typical pulsed high frequencies, high frequencies at two power levels of ON/OFF or High/Low are repeatedly and intermittently output.

FIG. 22(a) shows a pulsed high frequency whose power level changes repeatedly between ON and OFF, and FIG. 22(d) shows a pulsed high frequency whose power level repeatedly changes between High and Low. The pulsed high frequency in FIG. 22(a) is an example that has two power levels of an ON state where a high frequency is output and an OFF state where a high frequency is not output (ON/OFF), and the pulsed high frequency in FIG. 22(d) is an example that has two power levels of a High state where a high frequency at a high power level is output and a Low state where a high frequency at a low power level is output (High/Low).

FIGS. 22(b) and 22(e) show power levels P of pulsed high frequencies, in which amplitudes of pulse waveforms represent power levels of high frequencies. The power levels can be acquired by converting the pulsed high frequency into a DC.

In recent years, there has been a demand for a pulsed high frequency with three or more power levels. FIGS. 23(a) to 23(c) show examples of pulsed high frequencies with three power levels. FIG. 23(a) shows a pulsed high frequency which is output intermittently, and FIG. 23(b) shows a frequency with the power level at level 3 (High/Low/OFF).

When using a pulsed high frequency output from a power supply device, it is required to monitor (watch) a power level of the output pulsed high frequency. There is a known art disclosed in Patent Literature 1 that is a detection circuit for detecting the specifications of a pulse. However, there are no arts known as high-frequency monitoring device for monitoring a power level of a pulsed high frequency. In order to detect the specifications of a pulse, a pulse specifications detection circuit disclosed in Patent Literature 1 compares levels of input signals with the latest level stored in a slice level setting function, and when a signal whose level is beyond a threshold value is input, issues a command to detect the specifications of the concerned input signal.

Patent Literature 2 and Patent Literature 3 are also known as prior arts for determining a level of a high-frequency signal. Patent Literature 2 discloses a frequency conversion circuit that compares a reference voltage set by a resistance ladder circuit with a level detecting signal by means of a comparator, and on the basis of a comparison result, outputs a level signal. Patent Literature 3 discloses a system for generating adaptive level determination voltage that comprises a determination voltage generation circuit, an analog comparator and a discrimination circuit.

CITATION LIST

Patent Literature

[Patent Literature 1] Japanese Patent Laid-Open Publication No. 2006-170816
[Patent Literature 2] Japanese Patent Laid-Open Publication No. 2013-21438
[Patent Literature 3] Japanese Patent Laid-Open Publication No. 1989-236747

SUMMARY OF THE INVENTION

Problems to be Solved by the Invention

A monitor for a pulsed high frequency compares a DC-converted power level with threshold values to monitor a change in the power level. As threshold values to be used for the comparison of the power level, a maximum value and a minimum value of power of the pulsed high frequency in the previous cycle are employed. In FIGS. 22(b) and 22(e), values including a margin between the maximum value and the minimum value of the power level in the previous cycle are defined as threshold A and threshold B, respectively, and a power level in the next cycle is compared with the thresholds A and B so as to detect a change in the power level that is an increase or decrease of the power level. In FIG. 22, a power level that exceeds the threshold value A is defined as a level A while a power level that is below the threshold value B is defined as a level B, thereby determining about the ON/OFF state in FIG. 22(c) and about the High/Low state in FIG. 22(f).

In the case where the power is of three levels, it is necessary to define three different threshold values. In FIG. 23(b), a threshold value A, a threshold value B and a threshold value C are defined for the determination of the power of three levels. For the threshold value A and the threshold value B, the maximum value and the minimum value of the power level in the previous cycle can be defined as the threshold value A and the threshold value B, respectively, as with the case of the power of two levels. On the other hand, in order to determine a level C, it is necessary to define another threshold value C, but the value C cannot be obtained from the maximum value or minimum value of the power level in the previous cycle. Even though the value of the level C of the power in the previous cycle can be used as a threshold value, it is required to detect a change in the power level. However, since the change in the power level cannot be detected, the level C acquired in the previous cycle cannot be used as an appropriate threshold value if the change occurs in the power level.

On the other hand, although it is possible to use a fixed threshold value C instead of the varying threshold value C, it is necessary to set an appropriate threshold value C applicable to the level C of any pulsed high frequencies in regard to every pulsed high frequency output by a high-frequency power source.

Furthermore, since a load connected to the high-frequency power source causes a change in a waveform of a pulsed high frequency, false detection may occur when a fixed threshold value is used for the threshold value A and the threshold value B as well as the threshold value C.

An object of the present invention is to solve the above-described drawbacks and monitor a power level of a pulsed high frequency without using threshold values.

Means for Solving the Problem

A pulsed high frequency is a high-frequency signal that intermittently outputs pulsed high-frequencies obtained by making continuous high-frequencies in several cycles as one pulse, and there may be various patterns of the pulsed high frequency depending on a pulse period and others of each pulse, as well as power level thereof. The pulsed high frequency monitor of the present invention monitors a power level based on a transition pattern of the power level of a pulsed high frequency that changes in a time series, instead of monitoring the power level of the pulsed high frequency by comparing the power level with the threshold values.

(Determination about Transition Pattern)

The pulsed high frequency monitor of the present invention includes a DC conversion circuit that converts a pulsed high frequency into a DC to output a power level, a power level change detection circuit that detects a change in the power level, and a transition pattern determination circuit that determines a transition pattern of the power level in a time series.

(a) The DC conversion circuit is for removing a harmonic component in the pulsed high frequency to extract a DC component, and an envelope detection circuit may be used as the DC conversion circuit, by way of example. An output waveform from the DC conversion circuit is a pulse waveform of the pulsed high frequency that represents the power level of the pulsed high frequency.

(b) The power level change detection circuit is for detecting a change in the power level obtained by the DC conversion circuit. In the case of two power levels, the power has two levels (ON/OFF) that are an ON state having a power level and an OFF state having no power level, or levels of two grades (High/Low) that are a High state with a high power level and a Low state with a low power level.

In the case of three power levels, the power has levels of three grades (High/Low/OFF) that are the High state with the high power level, the Low state with the low power level and the OFF state with no power level. The power level change detection circuit detects the changes in these levels of the power.

The time series of the change in the power level includes information on the transition patterns in time-dependent changes in the power level, such as transition pattern in the time series of increase and decrease in the level, transition pattern in the time series of increase and decrease in the magnitude of the level.

(c) The transition pattern determination circuit determines a transition pattern of the power level in a time series which is included in the time series of the changes in the power level. The transition patterns of the power level in the time series differ depending on the types of the pulsed high frequencies. The pulsed high frequency monitor of the invention uses the transition patterns of the power level in the time series as indices of the power level monitoring.

Since the power level monitoring by means of the transition patterns of the power level in the time series does not need to use any threshold values for comparing with the power level, it is possible to solve the problems of changes in threshold values with the changes in the power level, setting of many threshold values, and others.

(Detection of Frequency Characteristics)

The pulsed high frequency monitor of the invention may be configured to have a frequency characteristics detection circuit for detecting frequency characteristics of a pulsed high frequency.

The frequency characteristics detection circuit measures a time width of the level change detected by the power level change detection circuit to thereby detect a frequency in a pulse period of the pulsed high frequency and a duty cycle in each pulse period of the pulsed high frequency.

(Noise Removal)

The pulsed high frequency monitor of the invention may be configured to have a noise removing circuit for removing noise contained in the power level in the power level change detection circuit.

The noise removing circuit has two configurations. A first configuration is for removing noise generated on an edge of a pulse of the pulsed high frequency, and a second configuration is for removing noise generated in a level section of a pulse of the pulsed high frequency.

First Configuration of Noise Removal:

The first configuration of the noise removing circuit is for removing level changes continuously detected in a predetermined time by the power level change detection circuit as noise from a power level change.

Second Configuration of Noise Removal:

The second configuration of the noise removing circuit is for removing a level change, in which the power level detected by the power level change detection circuit does not continue for a predetermined time, as noise from a power level change.

In the monitoring using a transition pattern of a change in a power level in a time series, the pulsed high frequency monitor of the invention has a first configuration for monitoring using a transition pattern of increase and decrease in the power level in the time series and a second configuration for monitoring using a transition pattern of transition of the power level in the time series.

First Configuration of Pulsed High Frequency Monitor (Determination about Transition Pattern)

In the first configuration of the pulsed high frequency monitor, a time-series pattern in a transition direction of power level is used as a transition pattern for a determination about a transition pattern of a power level in a times series made by the transition pattern determination circuit.

The transition pattern determination circuit includes a transition direction detection circuit that detects a transition direction of a power level, and a transition direction pattern determination circuit that compares a time-series pattern in the transition direction of the power level detected by the transition direction detection circuit with a transition direction pattern to be used for transition pattern determination.

The transition direction of the power level is a change direction of the power level. For example, if power has two levels (ON/OFF), the transition directions are on a rising edge where the power level changes from an OFF state into an ON state and a falling edge where the power level changes from the ON state into the OFF state. The time-series patterns in the transition directions of the power level mean patterns of the transition directions of on the rising-edge and the falling-edge in the time series.

The time-series pattern in the transition direction of the power level has a different number of levels of the power level and a different order of time-series directions of the power level for each type of pulsed high frequencies, and a time-series pattern in a transition direction of a power level specified for each type of pulsed high frequencies is predefined as a transition direction pattern for transition pattern determination. The number of the transition direction patterns for transition pattern determination is $2n^{-2}$ when the number of the power level is n. For example, when the number of levels is 2, the number of the patterns is $2^0=1$ when the number of the levels is 3, the number of the patterns is $2^1=2$, when the number of the levels is 4, the number of the patterns is $2^2=4$, and when the number of the levels is 5, the number of patterns is $2^3=8$. The transition pattern determination circuit compares a transition direction pattern for transition pattern determination as an index with a time-series pattern in a transition direction of a power level detected to monitor a pulsed high frequency.

(Detection of Frequency Characteristics)

The frequency characteristics detection circuit for detecting frequency characteristics of a pulsed high frequency includes a period detection circuit that detects a pulse period of a pulsed high frequency. The period detection circuit detects an edge of a time-series pattern in a transition direction of power level detected by the transition direction detection circuit. A pulse period is detected from a time width between the edges. On the basis of the pulse period, a frequency and a duty cycle of the pulsed high frequency are detected.

Second Configuration (Determination about Transition Pattern)

In the second configuration of the pulsed high frequency monitor, a time-series pattern of power level transition is used as a transition pattern for a determination about a transition pattern of a power level in a time series performed by the transition pattern determination circuit.

The transition pattern determination circuit includes a transition level detection circuit that detects a transition level of a power level, and a transition level pattern determination circuit that compares a time-series pattern of the transition level of the power level detected by the transition level detection circuit with a transition level pattern for transition pattern determination.

The transition of the power level is a combination of levels including an order of a change of the changing power level.

For example, when the power has three levels (High/Low/OFF), the transition is a combination of changing levels including an order of changes at three levels, and there are two time-series patterns of the transition levels, i.e., a transition pattern of the levels of High/Low/OFF and a transition pattern of the levels of High/OFF/Low.

The time-series pattern of the transition level of the power level has a different number of levels of the power level and a different order of time-series direction of the power level for each type of pulsed high frequencies, and a time-series pattern of the transition level of the power level specified for each of the pulsed high frequencies is predefined as a transition level pattern for transition pattern determination.

The number of the transition level patterns for transition pattern determination is $_{n-1}C_1 \times _{n-2}C_1 \times \ldots \times _1C_1$ when the number of the power level is n. For example, when the number of levels is 2, the number of the patterns is $_1C_1=1$, when the number of the levels is 3, the number of the patterns is $_2C_1 \times _1C_1=2$, when the number of the levels is 4, the number of the patterns is $_3C_1 \times _2C_1 \times _1C_1=6$, and when the number of the levels is 5, the number of patterns is $_4C_1 \times _3C_1 \times _2C_1 \times _1C_1=24$. The transition pattern determination circuit compares a transition level pattern for transition pattern determination as an index with a time-series pattern of the transition level of the power level so as to monitor a pulsed high frequency.

(Detection of Frequency Characteristics)

The frequency characteristics detection circuit for detecting frequency characteristics of a pulsed high frequency includes a period detection circuit that detects a pulse period of the pulsed high frequency. The period detection circuit detects a pulse period from a period pattern of a time series of a transition level detected by the transition level pattern determination circuit. In this regard, a pulse period is detected from a time width between edges. On the basis of the pulse period, a frequency and a duty cycle of the pulsed high frequency are detected.

Effects of the Invention

As described above, the present invention can monitor the transition of a pulsed high frequency without using threshold values. In addition to that, the present invention can detect the transition of a power level in the pulsed high frequency without using the threshold values.

BRIEF DESCRIPTION OF THE DRAWINGS

FIG. 23 illustrates an example of a conventional pulsed high frequency having three power levels.

BEST MODE FOR CARRYING OUT THE INVENTION

A pulsed high frequency monitor of the present invention monitors a power level based on a transition pattern of a power level of a pulsed high frequency which changes in a time series. Since the monitoring of the power level is based on the transition pattern, it is not necessary to use a threshold value for comparison with the power level of the pulsed high frequency, and an occurrence of a malfunction due to a change in the power level can be avoided.

Now, a schematic configuration of the pulsed high frequency monitor will be described with reference to FIG. 1, a first configuration of the pulsed high frequency monitor will be described with reference to FIGS. 2 to 8, and a second configuration of the pulsed high frequency monitor will be described with reference to FIGS. 13 to 21. Furthermore, noise removal will be described with reference to FIGS. 9 to 12.

Configuration of Pulsed High Frequency Monitor

Figure 1:
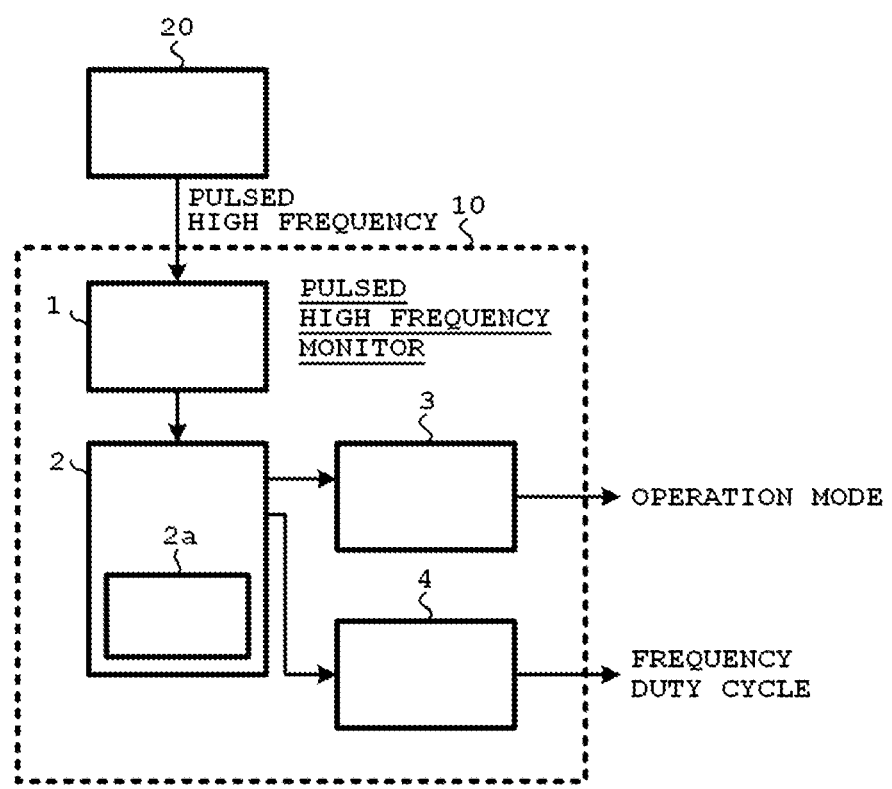
FIG. 1 illustrates a schematic configuration of a pulsed high frequency monitor according to the invention.

With reference to FIG. 1, a description will now be made about the schematic configuration of the pulsed high frequency monitor of the present invention. FIG. 1 shows a configuration of monitoring a pulsed high frequency output from a high frequency power source 20 by means of a pulsed high frequency monitor 10.

The pulsed high frequency monitor 10 is configured to monitor transition of a power level of a pulsed high frequency in a time series to thereby provide a type of an operation mode of the pulsed high frequency based on a transition pattern of the power level. The transition pattern of the power level has the following time-series patterns:

(i) a time-series pattern of a transition direction that is a direction of increase/decrease in the power level; and (ii) a time-series pattern of transition order of a change in magnitude of the power level.

The pulsed high frequency monitor 10 of the invention comprises a DC conversion circuit 1 that outputs a power level obtained by converting a pulsed high frequency into a DC, a power level change detection circuit 2 that detects a change in the power level, and a transition pattern determination circuit 3 that determines a transition pattern of the power level in a time series on the basis of the level change detected by the power level change detection circuit 2. Furthermore, the pulsed high frequency monitor 10 may be configured to have a frequency characteristics detection circuit 4 that detects frequency characteristics of a pulsed high frequency.

(a) DC Conversion Circuit:

The DC conversion circuit 1 removes a high-frequency component of a pulsed high frequency to extract a DC component. The DC conversion circuit 1 can employ an envelope detection circuit, by way of example. An output waveform by the DC conversion circuit 1 is a pulse waveform of a pulsed high frequency that represents a power level of the pulsed high frequency.

(b) Power Level Change Detection Circuit:

The power level change detection circuit 2 detects a change in the power level obtained by the DC conversion circuit 1. The power level may be a level in any grade. For example, if the power has two levels, it means that there are two levels of an ON state with a power level and an OFF state with no power level (ON/OFF), or two levels of a High state with a high power level and a Low state with a low power level (High/Low).

If the power has three levels, it means that there are three levels of the High state with the high power level, the Low state with the low power level and the OFF state with no power level (High/Low/OFF). The power level change detection circuit 2 detects changes between these power levels. The power level change detection circuit 2 may employ a differentiating circuit, for instance.

(c) Transition Pattern Determination Circuit:

As described above, a transition pattern of a power level includes as time-series pattern of a level change:

(i) a time-series pattern in a transition direction of the increase/decrease in a power level; and (ii) a time-series pattern of a transition order of a change in magnitude of a power level.

The transition pattern determination circuit 3 determines a transition pattern of a power level in a time series that is included in the time series of the change in the power level. The transition pattern of the power level in the time series differs depending on the type of a pulsed high frequency. The pulsed high frequency monitor of the invention adopts a transition pattern of a power level in a time series as an index of power level monitoring.

Since the monitoring of a power level by means of a transition pattern of the power level in a time series does not need the use of a threshold value for comparison of the power level, it is possible to resolve the problems of changes in threshold values with the changes in the power level, setting of many threshold values, and others.

(d) Frequency Characteristics Detection Circuit:

The frequency characteristics detection circuit 4 measures a time width of the level change detected by the power level change detection circuit to thereby detect a frequency in a pulse period of the pulsed high frequency and a duty cycle in each pulse period of the pulsed high frequency.

For the monitoring by using the transition pattern of the change in the power level in the time series, the pulsed high frequency monitor of the invention has a first configuration for monitoring a transition pattern of a time-series pattern in a transition direction of increase/decrease in a power level, and a second configuration for monitoring a transition pattern of a time-series pattern of a transition order of magnitude of a power level.

First Configuration of Pulsed High Frequency Monitor (Example of First Configuration)

Figure 2:
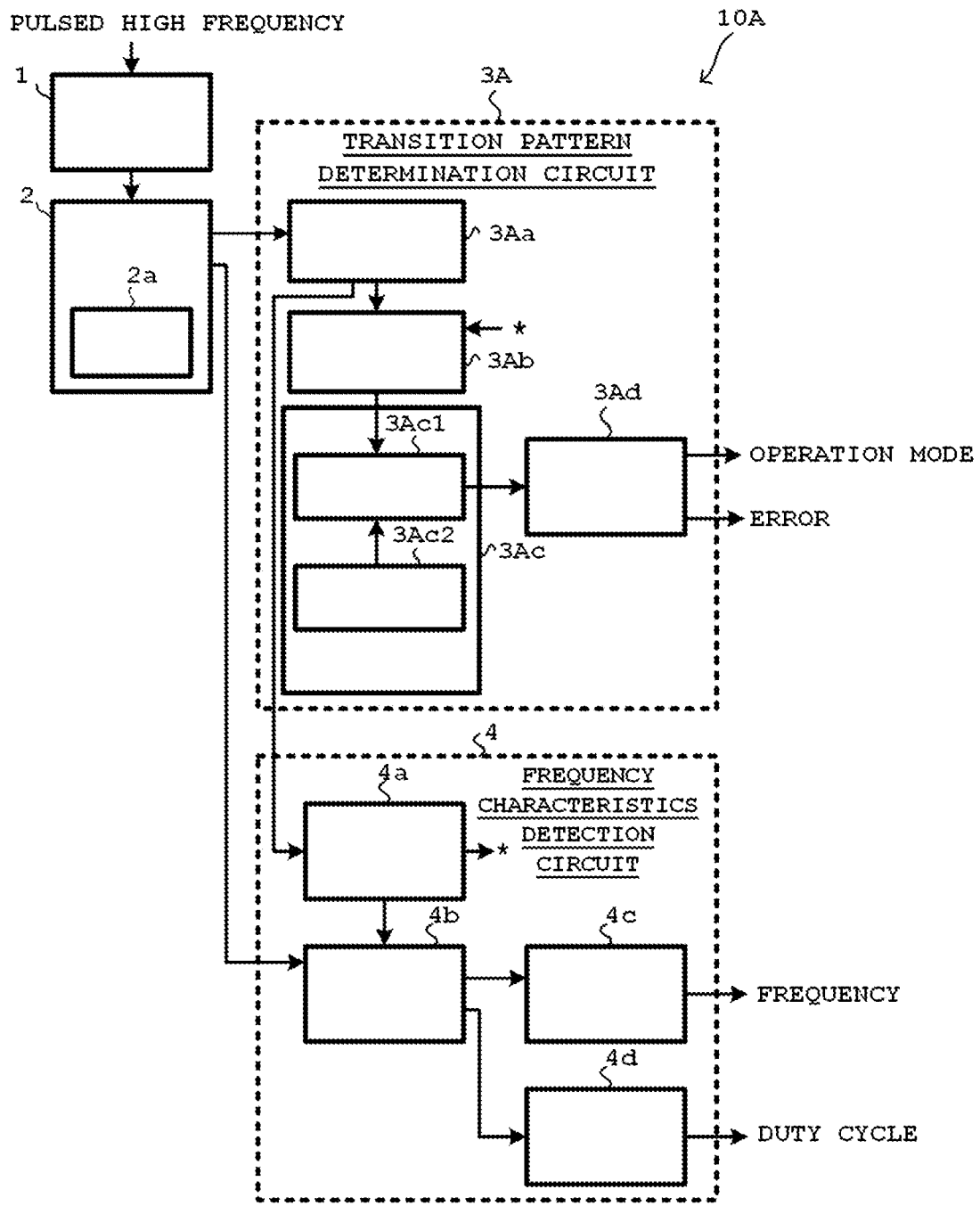
FIG. 2 illustrates an outline of an example of a first configuration of the pulsed high frequency monitor according to the invention.

A description will be made about an outline of an example of the first configuration by referring to FIG. 2.

A pulsed high frequency monitor 10A comprises a DC conversion circuit 1 that outputs a power level obtained by converting a pulsed high frequency into a DC, a power level change detection circuit 2 that detects a change in the power level, a transition pattern determination circuit 3A that determines a transition pattern of the power level in a time series on the basis of the level change detected by the power level change detection circuit 2, and a frequency characteristics detection circuit 4 that detects frequency characteristics of a pulsed high frequency. Noise contained in the power level during the conversion by the DC conversion circuit 1 is removed by a noise removing circuit 2a provided to the power level change detection circuit 2.

The transition pattern determination circuit 3A determines a transition pattern of the power level in the time series based on a time-series pattern in a transition direction where the power level increases or decreases, thereby outputting an operation mode that represents a type of the pulsed high frequency based on the transition pattern thus determined. In this context, the transition direction where the power level increases or decreases is not an absolute value of magnitude of the power level itself, but is a change direction where the power level increases or decreases.

For example, if the power has two levels of an ON state and an OFF state (ON/OFF), the transition pattern comprises a time-series pattern in a transition direction where the power level increases from the OFF state to the ON state and a time-series pattern in a transition direction where the power level decreases from the ON state to the OFF state. If the power has two levels of a High state in which the power level is high and a Low state in which the power level is low (High/Low), the transition pattern comprises a time-series pattern in a transition direction where the power level increases from the Low state to the High state and a time-series pattern in a transition direction where the power level decreases from the High state to the Low state.

Furthermore, if the power has three levels of the High state in which the power level is high, the Low state in which the power level is low and the OFF state in which there is no power level (High/Low/OFF), the transition pattern comprises time-series patterns in a transition direction where the power level increases and in a transition direction where the power level decreases among time-series patterns in a transition direction where the power level increases from the OFF state to the Low state, from the OFF state to the High state and from the Low state to the High state, and where the power level decreases from the High state to the Low state, from the High state to the OFF state and from the High state to the Low state.

The transition pattern determination circuit 3A comprises a transition direction detection circuit 3Aa, a transition direction time-series memory circuit 3Ab, a transition direction pattern determination circuit 3Ac and an operation mode encoder 3Ad.

The transition direction detection circuit 3Aa detects a transition direction of the power level based on a change in the power level detected by the power level change detection circuit 2.

The transition direction time-series memory circuit 3Ab stores the transition directions of the power level detected by the transition direction detection circuit 3Aa in order of time series.

The transition direction pattern determination circuit 3Ac comprises a comparison circuit 3Ac1 to compare a transition direction time-series pattern of a change in a power level in one cycle among the time-series patterns in the transition direction stored in the transition direction time-series memory circuit 3Ab with a transition direction pattern for transition pattern determination 3Ac2, so as to determine a type of a transition direction pattern. The transition direction time-series pattern in one cycle can be obtained in such a way that a pattern for one cycle is extracted from successive transition direction time series stored in the transition direction time-series memory circuit 3Ab. A period of the power level can be detected by a period detection circuit 4 provided to the frequency characteristics detection circuit 4, which will be described later.

In the transition direction pattern for transition pattern determination 3Ac2, time-series patterns in a transition direction where a power level transits at levels, such as two levels, three levels, four levels, are stored. The number of the transition direction patterns for transition pattern determination is $2n^{-2}$ when the power has n-levels. For example, when the power has two levels, the number of patterns is $2^0=1$ when the power has three levels, the number of patterns is $2^1=2$, when the power has four levels, the number of patterns is $2^2=4$, and when the power has five levels, the number of patterns is $2^3=8$. The transition direction pattern determination circuit 3Ac compares a time-series pattern in a transition direction of a detected power level with the transition direction pattern for transition pattern determination as an index.

An operation mode of a pulsed high frequency corresponds to a time-series pattern in a transition direction. For example, a pattern, in which increase and decrease in a transition direction are repeated, corresponds to an operation mode that repeats transition at two levels of the ON state and the OFF state of a pulsed high frequency, or the Low state and the High state of a pulsed high frequency. A pattern, in which increase and decrease in the transition direction are repeated twice and once, respectively, or repeated once and twice, respectively, corresponds to an operation mode that repeats the transition at three levels in the order of the OFF state, the Low state and the High state of the pulsed high frequency, or an operation mode that repeats the transition at three levels in the order of the High state, the Low state and the OFF state of the pulsed high frequency. The operation mode encoder 3Ad determines an operation mode of the pulsed high frequency based on a transition direction pattern determined by the transition direction pattern determination circuit 3Ac. In the case of where a time-series pattern in a transition direction does not match the transition direction pattern for transition pattern determination or operation pattern, the time-series pattern is considered as an error.

The frequency characteristics detection circuit 4 comprises the period detection circuit 4a, a time measuring circuit 4b, a frequency detection circuit 4c and a duty cycle detection circuit 4d, in order to detect a frequency with a pulse waveform of a pulsed high frequency and a duty cycle of the pulse waveform.

The period detection circuit 4a determines periodicity of a transition direction detected by the transition direction detection circuit 3Aa.

In an aspect of periodicity determination, when a power level continuously increases and then decreases or when the power level continuously decreases and then increases, the power level decreases or increases only once in one cycle, so that a periodicity determination can be made by detecting the decrease or increase in the level that occurs after the continuous increase or decrease. In an operation example of the first configuration described below, the periodicity is determined on the basis of the transition of a power level that occurs only once in one cycle.

In another aspect of periodicity determination, when a power level changes arbitrarily, the periodicity can be determined on the basis of a transition level pattern of the power level. In an operation example of the second configuration described below, the periodicity is determined based on a transition level pattern.

A pattern in a transition direction in a long period may have a pattern in a transition direction in a short period. Thus, the period detection circuit 4a defines the longest period to determine a transition direction pattern in the long period, thereby determining the periodicity in the transition direction to detect a period. The transition direction time-series memory circuit 3Ab extracts a time-series pattern of the transition direction based on the period detected by the period detection circuit 4a.

The time measuring circuit 4b measures a time width of the period detected by the period detection circuit 4a and a time width of the power level change detected by the power level change detection circuit 2.

The frequency detection circuit 4c detects a frequency of the pulsed high frequency based on the time width of the period measured by the time measuring circuit 4b.

The duty cycle detection circuit 4d detects a duty cycle with a pulse waveform of the pulsed high frequency based on the time width of the period and the time width of the power level change measured by the time measuring circuit 4b.

(Operation Example of First Configuration)

Figure 3:
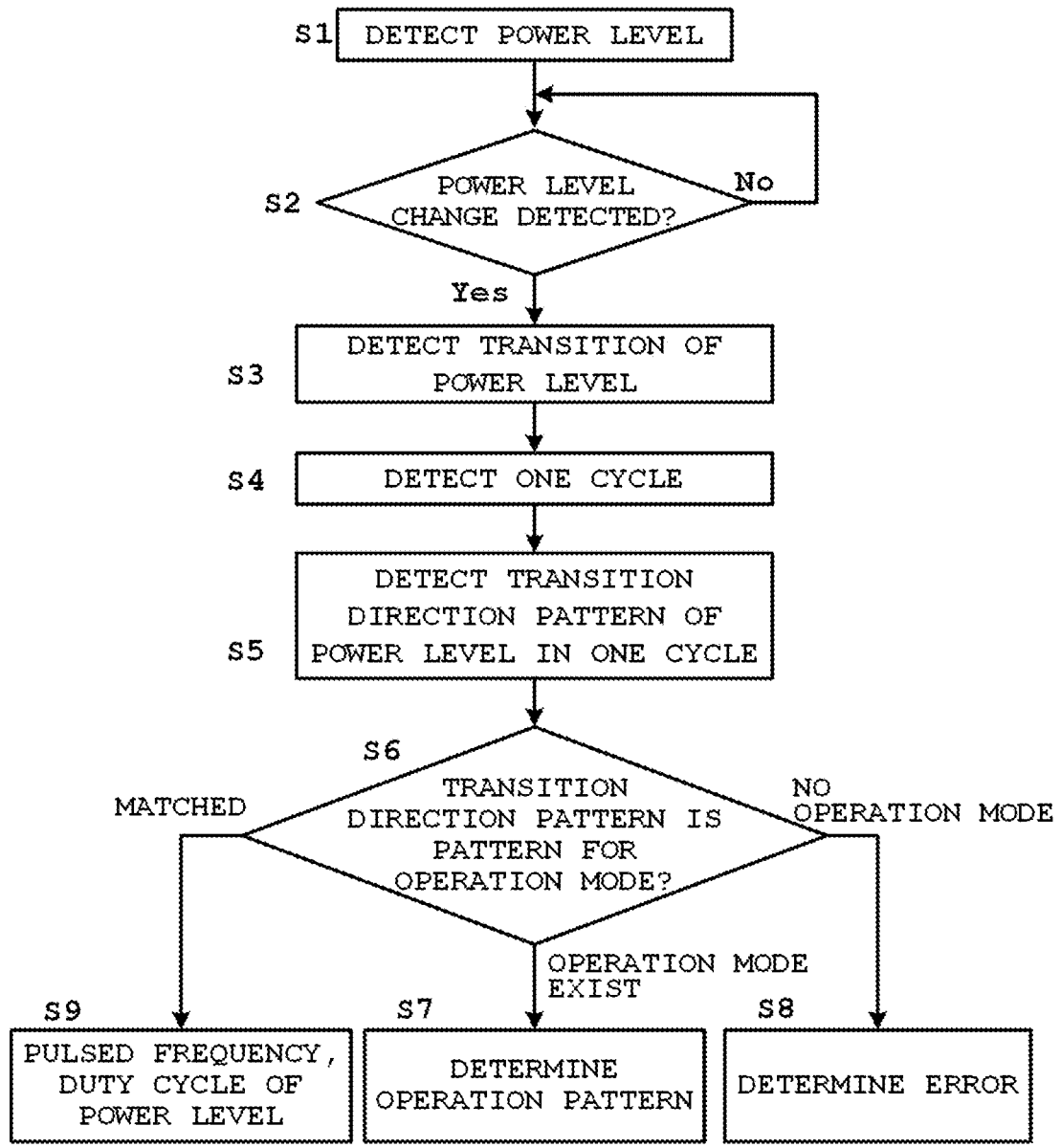
FIG. 3 is a flowchart illustrating an operation example of the first configuration of the pulsed high frequency monitor according to the invention.

The operation example of the first configuration will be described with reference to a flowchart of FIG. 3. The DC conversion circuit 1 converts a pulsed high frequency into a DC to detect a power level (S1). The power level change detection circuit 2 detects a change in an electric power level of the detected power level (S2). On the basis of the periodicity of the transition of the change in the level of the electric power thus detected, the transition pattern determination circuit 3A determines the operation mode of the pulsed high frequency, and the frequency characteristics detection circuit 4 detects a frequency and/or a duty cycle of the pulsed high frequency.

The transition direction detection circuit 3Aa detects a transition state of the power level (S3). The period detection circuit 4a detects one period of a transition pattern from the periodicity in the transition state of the power level (S4). The transition direction time-series memory circuit 3Ab stores a transition direction detected by the transition direction detection circuit 3Aa in a time series, and extracts the time series in the transition direction in one cycle detected by the period detection circuit 4a as a transition direction pattern (S5).

In the transition direction pattern determination circuit 3Ac, the comparison circuit 3Ac1 compares the extracted transition direction pattern with the transition direction pattern for transition pattern determination to thereby detect a transition direction pattern that matches the transition direction pattern for transition pattern determination (S6). The operation mode encoder 3Ad determines presence or absence of an operation mode that corresponds to the detected transition direction pattern, and when there is a corresponding operation mode, then outputs the concerned operation mode (S7), or when there is no corresponding operation mode, considers the detected pattern as an error (S8).

In the frequency characteristics detection circuit 4, the time measuring circuit 4b measures times widths of an ON period and an OFF period of a pulse for one cycle of the transition pattern detected by the period detection circuit 4a. The frequency detection circuit 4c detects a frequency based on the time widths for one period of the transition pattern, and the duty cycle detection circuit 4d detects a duty cycle based on the time widths of the ON period and the OFF period of the pulse (S9).

A description will now be made about operation examples at two power levels, three power levels and four power levels.

Figure 4:
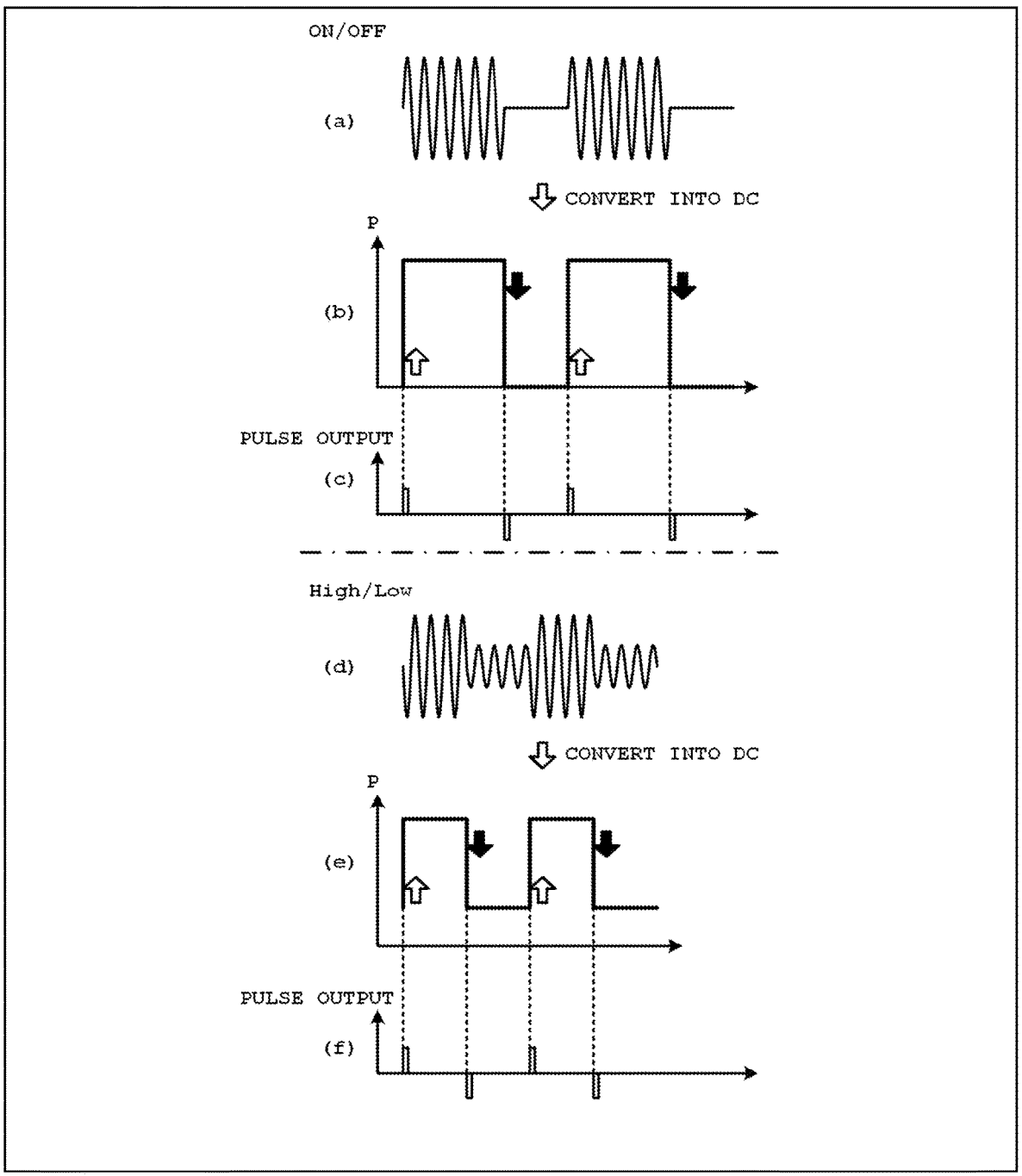
FIG. 4 illustrates operation examples at two levels of the first configuration of the pulsed high frequency monitor according to the invention.

(1) Operation Example at Two Levels:

The operation examples at two power levels will be described by referring to FIGS. 4 and 5. FIGS. 4(a) to 4(c) show examples that repeat two levels of an ON state and an OFF state, and FIGS. 4(d) to 4(f) show examples that repeat two levels of a High state and a Low state.

In the examples that repeat two levels of the ON state and the OFF state, a pulsed high frequency that repeats a high-frequency period and a zero-output period (FIG. 4(a)) is converted into a DC, so as to obtain a rectangular wave signal that repeats two voltage levels of an ON state and an OFF state (FIG. 4(b)). A transition state of the voltage level is detected at the rising edge (UP) and the falling edge (DOWN) of the rectangular wave signal. A transition level pattern is obtained from pulse outputs at the rising edge and the falling edge (FIG. 4(c)).

In the examples that repeats two levels of the High state and the Low state, a pulsed high frequency that repeats a high-frequency period at a high level and a high-frequency period at a low level (FIG. 4(d)) is converted into a DC, so as to obtain a rectangular wave signal that repeats two voltage levels of a High state and a Low state (FIG. 4(e)). A transition state of the voltage level is detected at the rising edge (UP) and the falling edge (DOWN) of the rectangular wave signal. A transition level pattern is obtained from pulse outputs at the rising edge and the falling edge (FIG. 4(f)). In light of periodicity, the number of transition level patterns with n-power levels can be presented as $_{n-1}C_1 \times _{n-2}C_1 \times \ldots \times _1C_1$, and thus when the levels are two, the number of transition level patterns is $_1C_1=1$.

Figure 5:
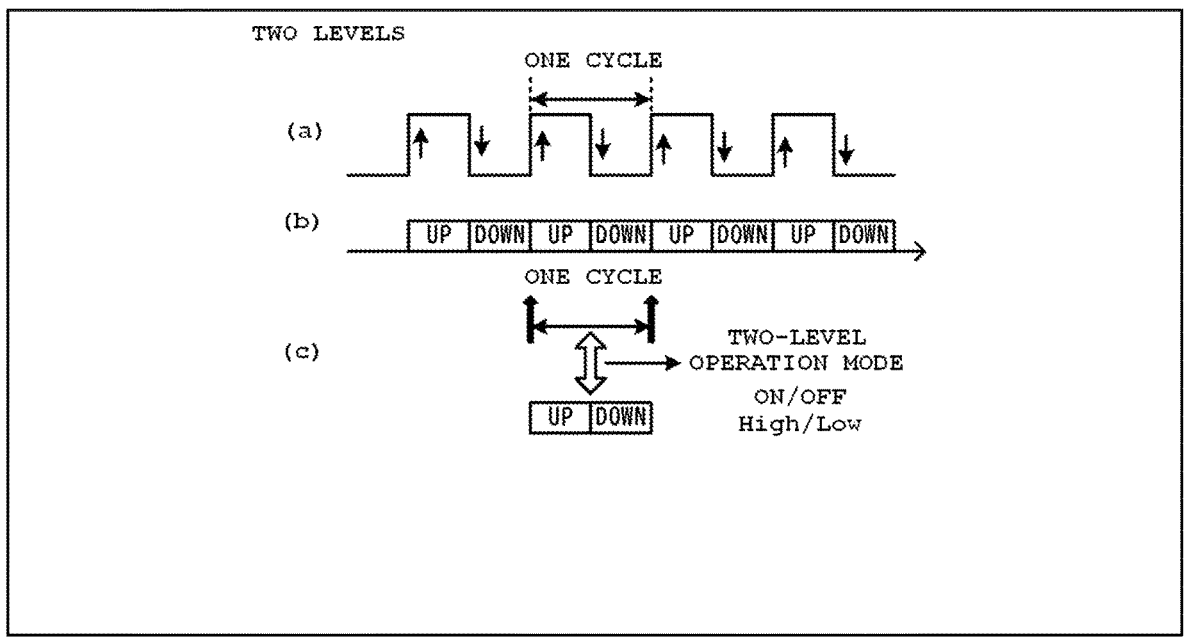
FIG. 5 illustrates an operation example for extracting an operation mode from transition level patterns at two levels of the first configuration of the pulsed high frequency monitor according to the invention.

FIG. 5 shows operation examples of extracting an operation mode from transition level patterns. The transition level patterns at (UP) and (DOWN) can be obtained at the rising edge and the falling edge of a rectangular wave signal (FIG. 5(a)) produced by converting a pulsed high frequency into a DC (FIG. 5(b)). The transition level pattern includes a period pattern (UP/DOWN) consisting of (UP) and (DOWN) as one cycle. From this period pattern (UP/DOWN), a two-level operation mode is extracted.

Table 1 shows a relationship between power level transition in the previous cycle of the two-level operation mode and an operation mode.

TABLE 1

| Power Level Transition in Previous Cycle | | Operation Mode |
|---|---|---|
| No. 1 | No. 2 | Determination |
| UP | DOWN | Two Levels (ON/OFF) (High/Low) |
|  | | |

(2) Operation Example at Three Levels:

The operation example at three levels will be described with reference to FIGS. 6 and 7. FIGS. 6(a) to 6(c) show examples that repeat three levels of a High state, a Low state and an OFF state in sequence, and FIGS. 6(d) to 6(f) show examples that repeat three levels of the Low state, the High state, and the OFF state in sequence.

In the example that repeats three levels in the order of the High state, the Low state and the OFF state, a pulsed high frequency that repeats in sequence a high-frequency period at a high level, a high-frequency period at a low level and a zero-output period (FIG. 6(a)) is converted into a DC to thereby obtain a rectangular wave signal that repeats three voltage levels of the High state, the Low state and the OFF state (FIG. 6(b)).

A transition state of the voltage level is detected at the rising edge (UP) and the falling edge (DOWN) of the rectangular wave signal. A transition level pattern is obtained from pulse outputs at the rising edge and the falling edge (FIG. 6(c)).

Figure 6:
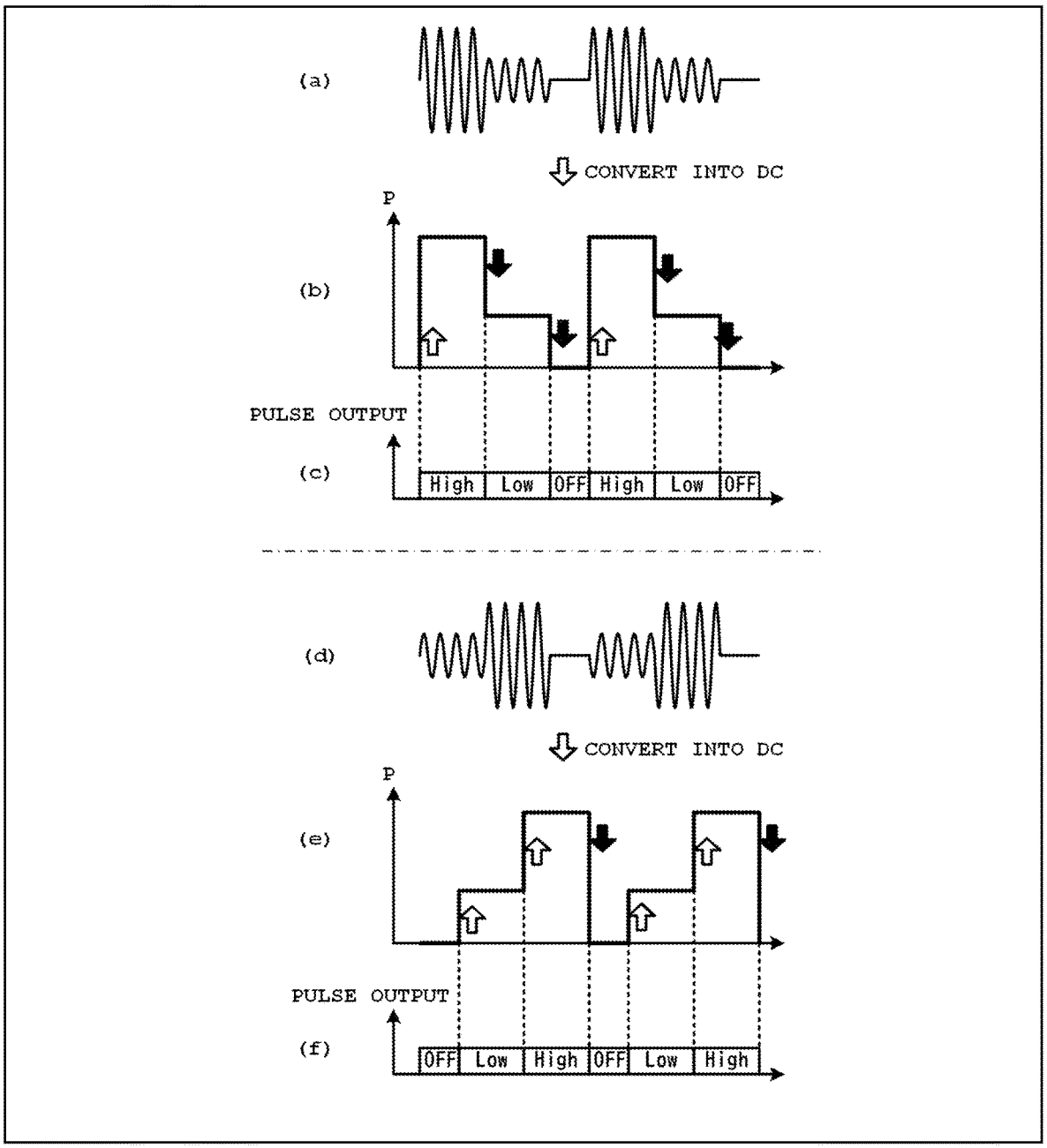
FIG. 6 illustrates operation examples at three levels of the first configuration of the pulsed high frequency monitor according to the invention.

In the examples that repeats three levels in order of the Low state, the High state and the OFF state, a pulsed high frequency that repeats a high-frequency period at a low level, a high-frequency period at a high level and a zero-output period in sequecy (FIG. 6(d)) is converted into a DC, so as to obtain a rectangular wave signal that repeats three voltage levels of a Low state, a High state and an OFF state (FIG. 6€).

A transition state of the voltage level is detected at the rising edge (UP) and the falling edge (DOWN) of the rectangular wave signal. A transition level pattern is obtained from pulse outputs at the rising edge and the falling edge (FIG. 6(f)).

Although the transition level pattern of the High state, the Low state and the OFF state and the transition level pattern of the Low state, the High state and the OFF state have in common that these patterns have three levels, these transition level patterns are distinguished from each other because these patterns are different in the orders of transition levels.

Figure 7:
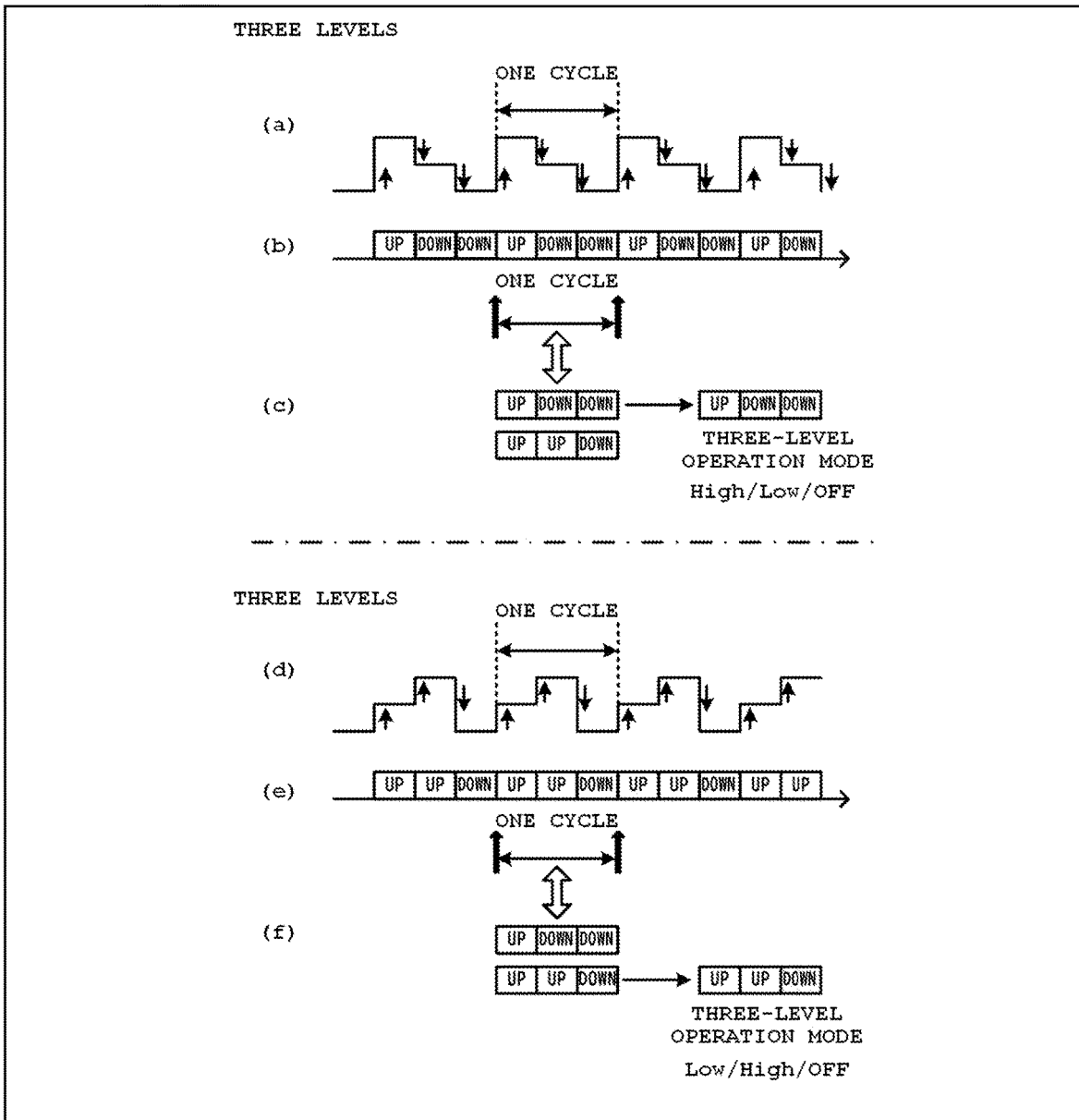
FIG. 7 illustrates an operation example for extracting an operation mode from transition level patterns at three levels of the first configuration of the pulsed high frequency monitor according to the invention.

FIG. 7 shows operation examples of extracting an operation mode from transition level patterns at three levels. FIGS. 7(a) to 7(c) show examples of a transition level pattern of a High state, a Low state and an OFF state, and FIGS. 7(d) to 7(f) show examples of a transition level pattern of the Low state, the High state, and the OFF state. When power has three levels, the number of transition level patterns is $_2C_1 \times _1C_1 = 2$.

In the examples of FIGS. 7(a) to 7(c), transition level patterns of (UP), (DOWN) and (DOWN) (FIG. 7(b)) can be obtained at the rising edge and the falling edge of a rectangular wave signal (FIG. 7(a)) produced by converting a pulsed high frequency into a DC. The transition level pattern includes a period pattern (UP/DOWN/DOWN) consisting of (UP), (DOWN) and (DOWN) as one cycle. From this period pattern (UP/DOWN/DOWN), a three-level operation mode of (High/Low/OFF) is extracted.

In the examples of FIGS. 7(d) to 7(f), transition level patterns at (UP), (UP) and (DOWN) (FIG. 7(e)) can be obtained at the rising edge and the falling edge of a rectangular wave signal (FIG. 7(d)) produced by converting a pulsed high frequency into a DC. The transition level pattern includes a period pattern (UP/UP/DOWN) consisting of (UP), (UP) and (DOWN) as one cycle. From this period pattern (UP/UP/DOWN), extracted is a three-level operation mode of (Low/High/OFF).

Table 2 shows a relationship between power level transition in the previous cycle of the three-level operation mode and an operation mode.

TABLE 2

| Power Level Transition in Previous Cycle | | | Operation Mode |
|---|---|---|---|
| No. 1 | No. 2 | No. 3 | Determination |
| UP | DOWN | DOWN | Three Levels (High/Low/OFF) |
| UP | UP | DOWN | Three Levels (Low/High/OFF) |
| 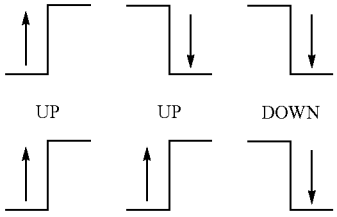 | | | |

(3) Operation Example at Four Levels:

The operation example at four levels will be described by referring to FIG. 8. In view of the periodicity, the number of transition level patterns with n-power levels can be presented as $_{n-1}C_1 \times _{n-2}C_1 \times \ldots \times _1C_1$, and thus when the levels are four, the number of transition level patterns is $_3C_1 \times _2C_1 \times _1C_1 = 6$. On the other hand, if the transition occurs successively in the same direction and then occurs in the opposite direction in one cycle of the power level transition, the number of transition level patterns is two.

FIGS. 8(a) to 8(c) show examples of repeating four levels at which a power level increases sequentially in a first High state, a second High state and a third High state, and then goes into a Low state or OFF state. FIGS. 8(d) to 8(f) show examples of repeating four levels at which a power level decreases sequentially in the third High state, the second High state and the first High state, and then goes into the Low state or OFF state.

A transition state of a voltage level is detected at the rising edge (UP) and the falling edge (DOWN) of a rectangular wave signal, and thereby a transition level pattern is obtained. Although the transition level patterns in the third High state, the second High state, the first High state, and in the Low state or OFF state have in common that these patterns have four levels, these transition level patterns are distinguished from one another because these patterns are different in the orders of transition levels.

Figure 8:
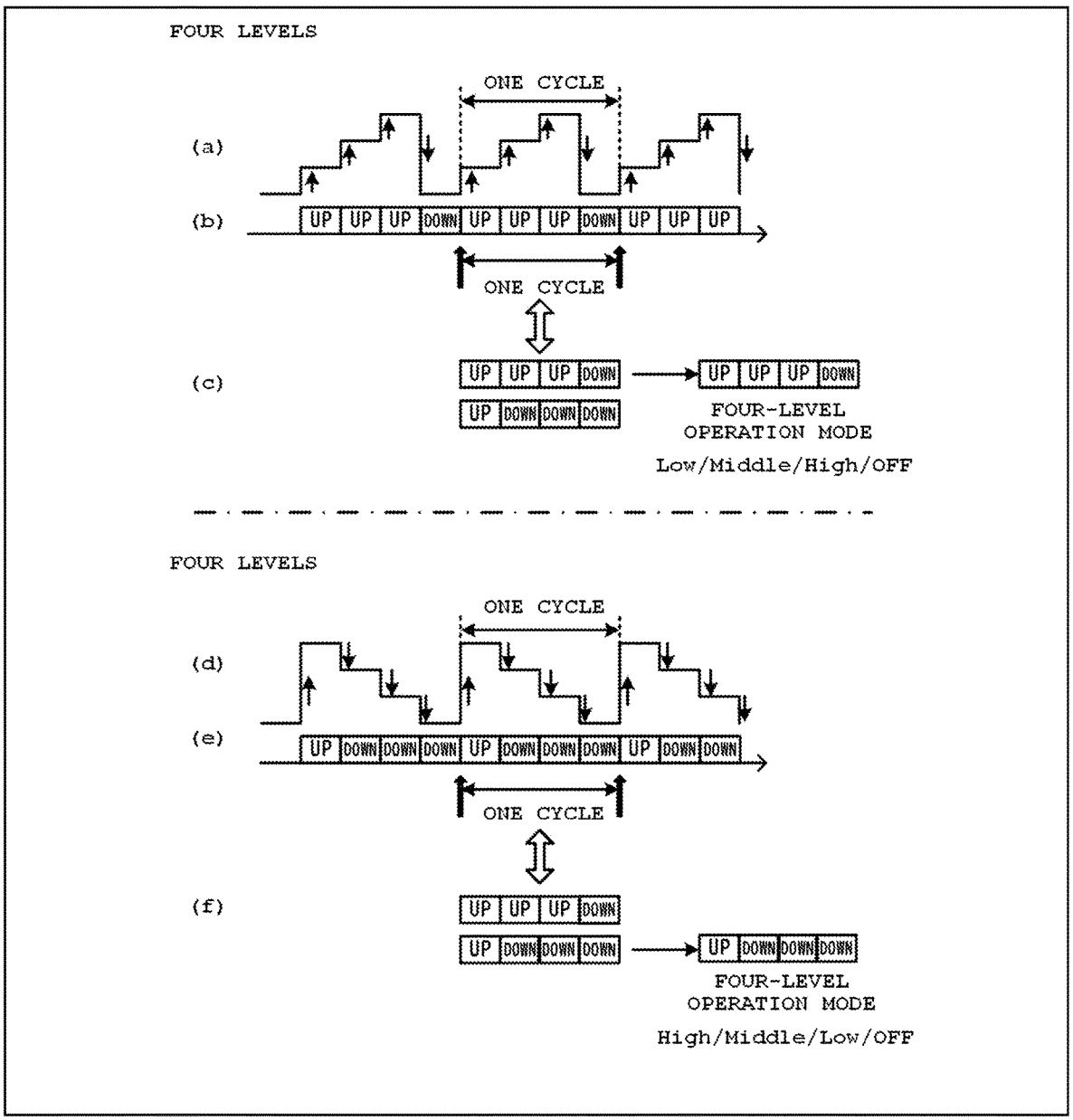
FIG. 8 illustrates an operation example for extracting an operation mode from transition level patterns at four levels of the first configuration of the pulsed high frequency monitor according to the invention.

FIG. 8 shows operation examples of extracting an operation mode from the transition level patterns at four levels. FIGS. 8(a) to 8(c) show examples of the transition level pattern at four levels in which the power level increases sequentially in the first High state, the second High state and the third High state, and then goes into the Low state or OFF state. FIGS. 8(d) to 8(f) show examples of the transition level patterns at four levels in which the power level decreases sequentially in the third High state, the second High state and the first High state, and then goes into the Low state or OFF state.

In the examples of FIGS. 8(a) to 8(c), transition level patterns at (UP), (UP), (UP) and (DOWN) (FIG. 8(b)) can be obtained at the rising edge and the falling edge of a rectangular wave signal (FIG. 8(a)) obtained by converting a pulsed high frequency into a DC. The transition level pattern includes a period pattern (UP/UP/UP/DOWN) consisting of (UP), (UP), (UP) and (DOWN) as one cycle. From this period pattern (UP/UP/UP/DOWN), extracted is a four-level operation mode of (the first High state, the second High state, the third High state, and then the Low state or OFF state).

In the examples of FIGS. 8(d) to 8(f), transition level patterns at (UP), (DOWN), (DOWN) and (DOWN) (€. 8(e)) can be obtained at the rising edge and the falling edge of a rectangular wave signal (FIG. 8(d)) obtained by converting a pulsed high frequency into a DC. The transition level pattern includes a period pattern (UP/DOWN/DOWN/DOWN) consisting of (UP), (DOWN), (DOWN) and (DOWN) as one cycle. From this period pattern (UP/DOWN/DOWN/DOWN), extracted is a four-level operation mode of (the third High state, the second High state, the first High state, and then the Low state or OFF state).

Table 3 shows a relationship between power level transition in the previous cycle of the four-level operation mode and an operation mode.

TABLE 3

| Power Level Transition in Previous Cycle | | | | Operation Mode |
|---|---|---|---|---|
| No. 1 | No. 2 | No. 3 | No. 4 | Determination |
| UP | UP | UP | DOWN | Four Levels (First High/ Second High/ Third High/ Low) |
| UP | DOWN | DOWN | DOWN | Four Levels (Third High/ Second High/ First High/ Low) |

The determination about the operation mode from the power level transition can be implemented not only in the operation examples of two levels, three levels and four levels of the power, but also five or more levels.

Next, the power level detection circuit 2 and the noise removing circuit 2a as well as their operation examples will be described.

Power Level Detection Circuit and Noise Removing Circuit (Configuration Example)

Figure 9:
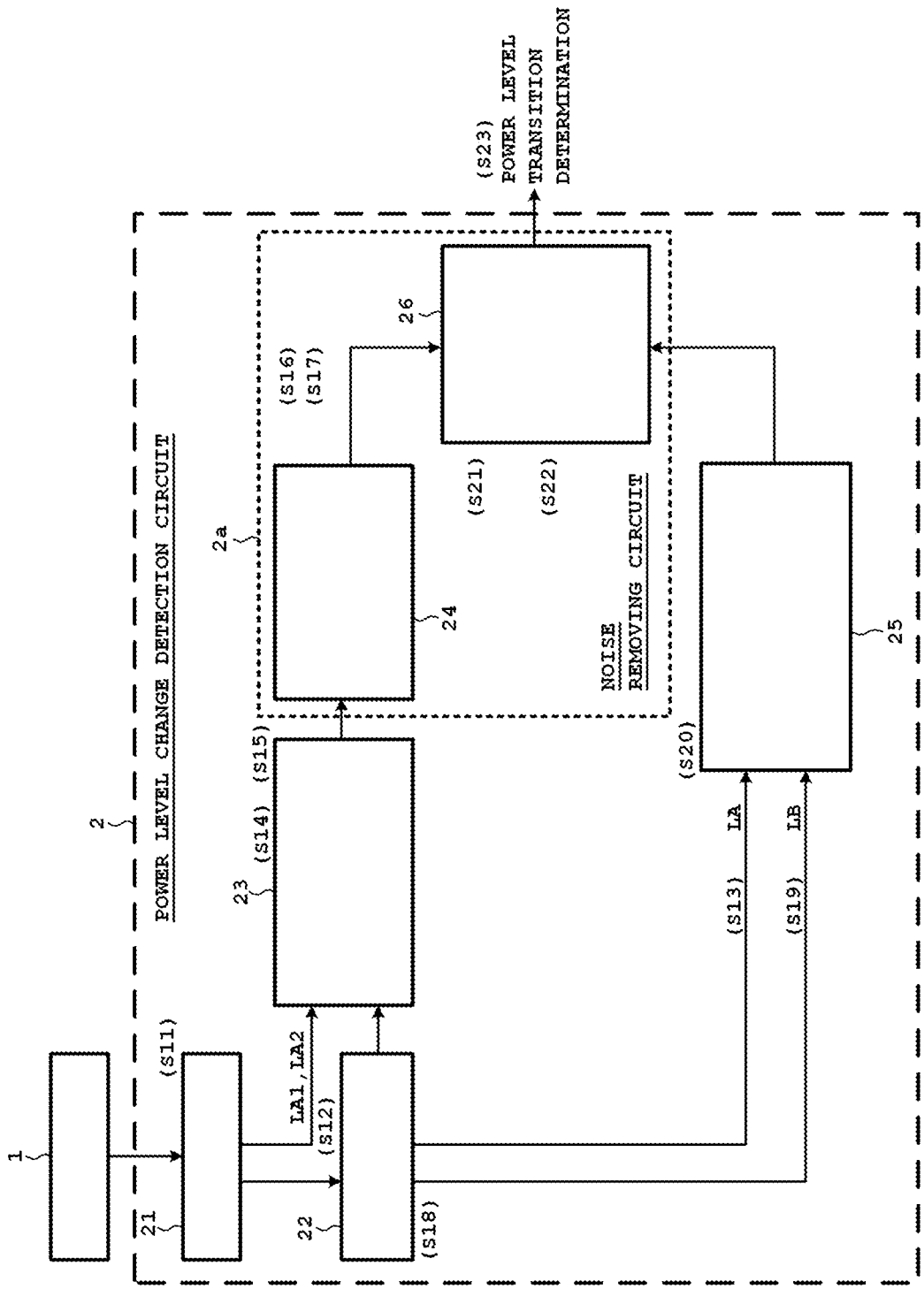
FIG. 9 is a block diagram showing a schematic configuration that illustrates configuration examples of a power level detection circuit and a noise removing circuit provided to the pulsed high frequency monitor according to the invention.

Configuration examples of the power level change detection circuit 2 and the noise removing circuit 2a will be described by referring to a schematic block diagram of FIG. 9. The power level change detection circuit 2 comprises a sampling circuit 21, a power level fluctuation detection circuit 22, a first power level change direction detection circuit 23, a first noise removing circuit 24, a second power level change direction detection circuit 25, a power level transition determination circuit 26 that includes a second noise removing circuit. The first noise removing circuit 24 and the second noise removing circuit form the noise removing circuit 2a.

The sampling circuit 21 samples a level of power converted by the DC conversion circuit 1 in a predetermined sample cycle to thereby output a power level value at a time of sampling.

The power level fluctuation detection circuit 22 compares data value of a power level L1 sampled at a detection point A1 with a power level L2 sampled at a detection point A2 to detect fluctuation of the power level. When there is a difference in the date values between the power level L1 and the power level L2, the circuit 22 detects that the power level has fluctuated, and when there is no difference in the data value, detects that the power level has not fluctuated. The power level fluctuation detection is performed by updating successively the detection points A1, A2 in a time series so as to detect a change in time of the power level fluctuation.

The first power level change direction detection circuit 23 detects a change direction of the power level at the time of fluctuation (detection point A) of the power level detected by the power level fluctuation detection circuit 22. Hereinafter, the detection point at which the fluctuation occurs in the power level will be indicated with "A", and the change direction will be indicated with "DA".

The first power level change direction detection circuit 23 defines a change direction when the power level L2 at the detection point A2 is greater than a power level LA1 at the detection point A1 as "increase direction", a change direction when the power level L2 at the detection point A2 is smaller than the power level LA1 at the detection point A1 as "decrease direction", and a change direction when the power level L2 at the detection point A2 is equal to the power level LA1 at the detection point A1 as "no fluctuation", in order to detect the change direction DA of the power level where the detection point A1 is determined as the detection point A.

The second power level change direction detection circuit 25 detects a change direction of a power level between the detection point A and a detection point B on the basis of the power level LA at the detection point A and a power level LB at the detection point B. As described above, the detection point A is the fluctuation point of the power level, and the detection point B is a point after a noise fluctuation abates upon expiry of a noise determination time. The noise determination time is defined based on a preset noise determination period T. The presence or absence of the fluctuation of the power level is detected between the detection point A at which the fluctuation of the power level occurs and the noise determination period T, and when no fluctuation of the power level is detected at the time of lapse of the noise determination period T, the concerned point is defined as the detection point B. If the fluctuation of the power level is continuously detected at the time of lapse of the noise determination period T, the detection of the presence or absence of the fluctuation of the power level is performed again during the next noise determination period T.

When the noise determination period T passes over, the detection of the fluctuation of the power level after the lapse of the period T is repeated, and a point at which no fluctuation of the power level is detected is defined as the detection point B to thereby detect the power level LB at the detection point B.

The second power level change direction detection circuit 25 compares the magnitude of the power level LA with that of the power level LB to detect a change direction of a power level. Hereinafter, a change direction of a power level between the detection point A and the detection point B will be indicated with "DB".

The second power level change direction detection circuit 25 defines a change direction when the power level LB at the detection point B is greater than the power level LA at the detection point A as "increase direction", defines a change direction when the power level LB at the detection point B is smaller than the power level LA at the detection point A as "decrease direction", and defines a change direction when the power level LB at the detection point B is equal to the power level LA at the detection point A as "no change", in order to detect a change direction DB of the power level between the detection point A and the detection point B.

The first noise removing circuit 24 is configured to remove noise during a noise period with respect to a detected output from the first power level change direction detection circuit 23 in such a way that the noise removal is carried out to remove noise generated by a change in the power level at the detection point A to thereby prevent a false detection of power level transition due to the noise.

The power level transition determination circuit 26 determines whether the transition of the power level has occurred based on the change direction DA at the detection point A by the first power level change direction detection circuit 23 and the change direction DB between the detection points A, B by the second power level change direction detection circuit 25, both of directions being obtained via the first noise removing circuit 24. The power level transition determination circuit 26 forms the second noise removing circuit for removing the noise at the detection point A, in addition to the determination about the occurrence of the power level transition.

In this way, the noise removing circuit 2a comprises two elements, namely the first noise removing circuit 24 for removing noise during the noise period and the second noise removing circuit included in the power level transition determination circuit 26.

For the removal of noise contained in a power level, the present invention provides a first configuration and a second configuration. The first configuration of the noise removal is for removing noise generated during power level transition at which a power level obtained by the DC conversion changes, so as to eliminate changes in the level as noise from the power level change which are continuously detected within a predetermined time during which the power level change detection circuit performs the detection.

A noise generated at an edge part of a pulse of a pulsed high frequency is removed.

The first configuration corresponds to the second noise removing circuit included in the power level transition determination circuit 26.

The second configuration of the noise removal is for removing noise generated when the power level obtained by the DC conversion is flat without changing, so as to remove noise generated at a level interval of a pulse of a pulsed high frequency. The second configuration eliminates a level change as noise from the power level change in which change the power level detected by the power level change direction detection circuit does not continue for a predetermined time. The second configuration corresponds to the first noise removing circuit 24 for removing noise during the noise period.

(Operation Example)

Figure 10:
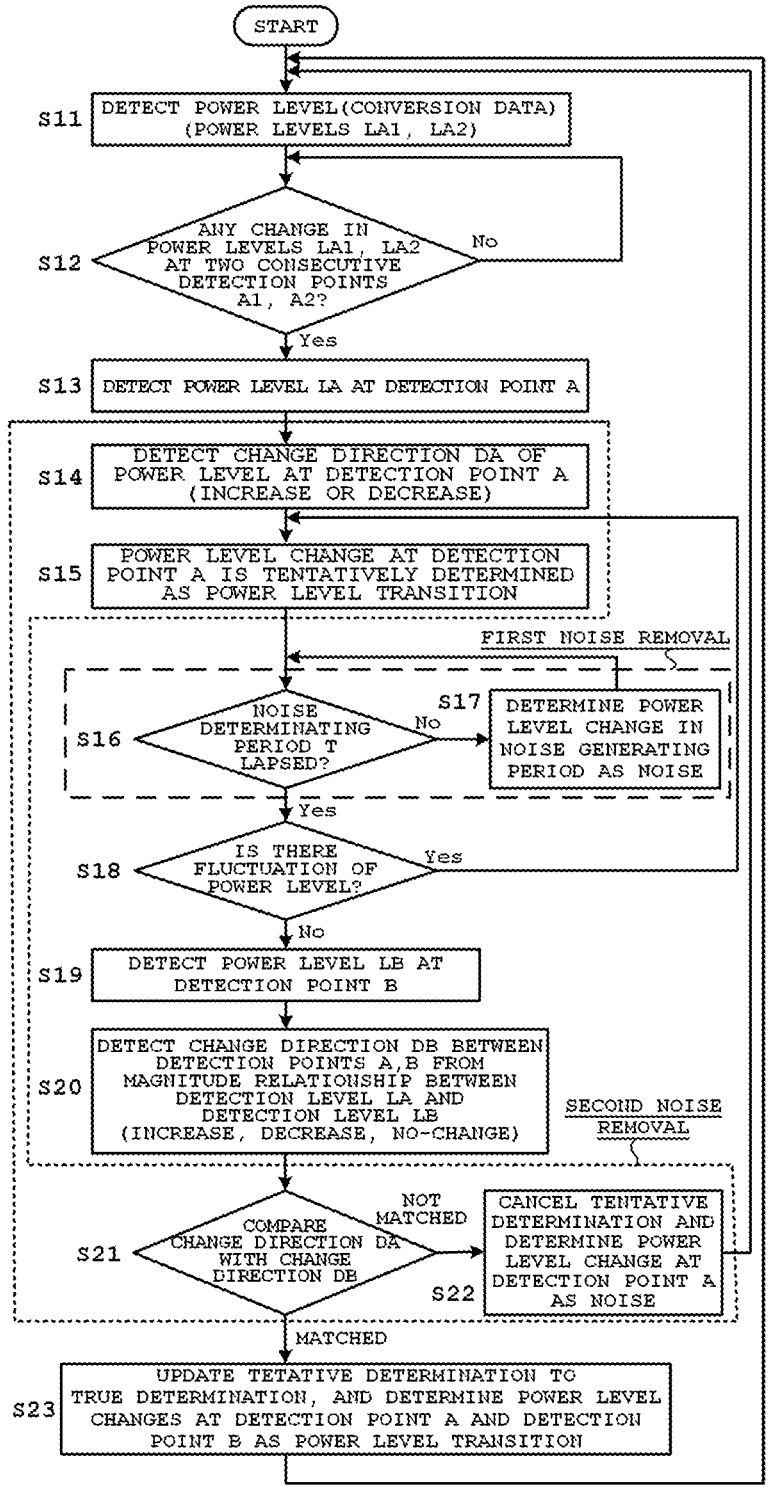
FIG. 10 is a flowchart illustrating operation examples of the power level detection circuit and the noise removing circuit of the pulsed high frequency monitor according to the invention.
Figure 11:
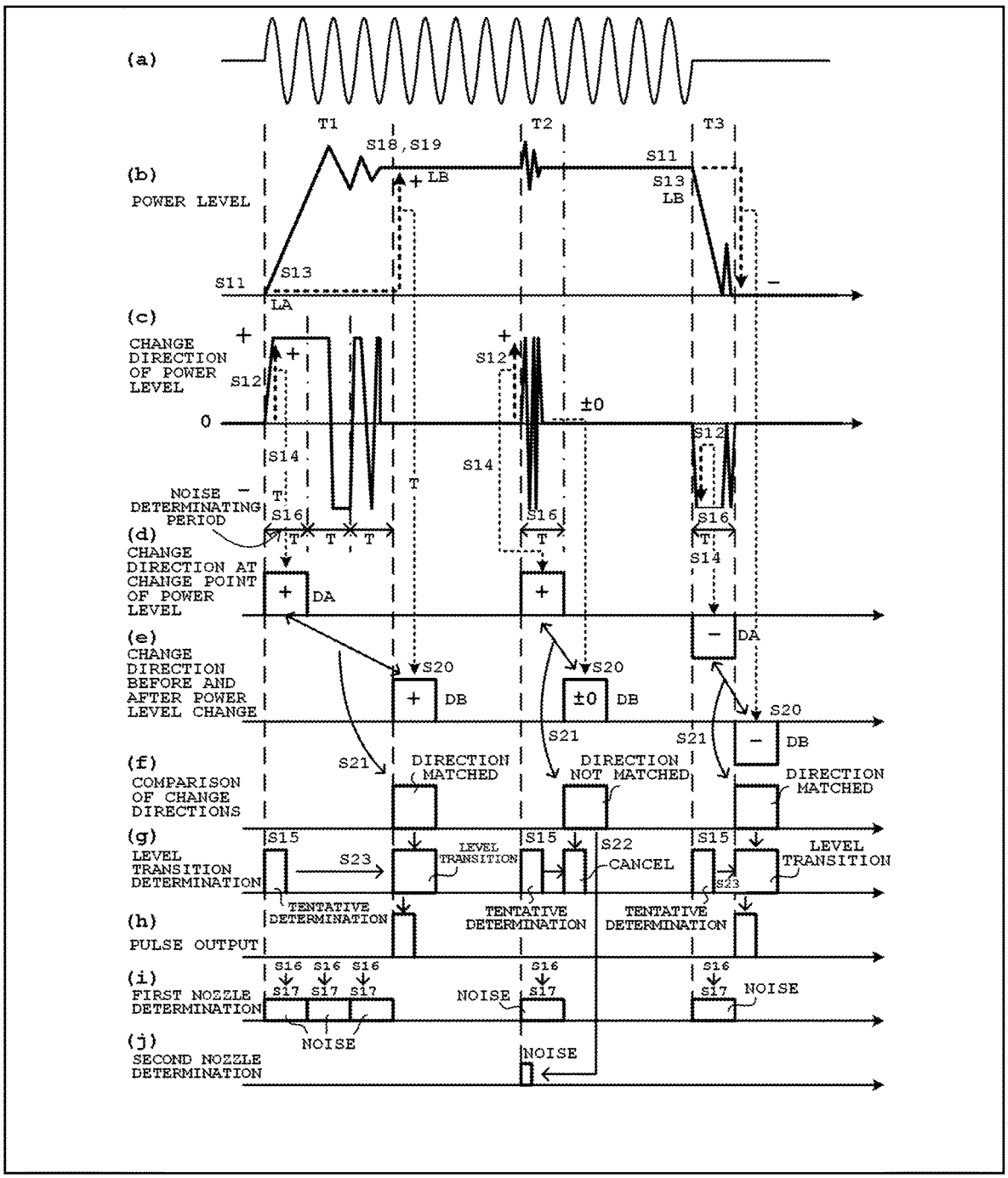
FIG. 11 is a signal diagram illustrating the operation example of the power level detection circuit and the noise removing circuit of the pulsed high frequency monitor according to the invention.
Figure 12:
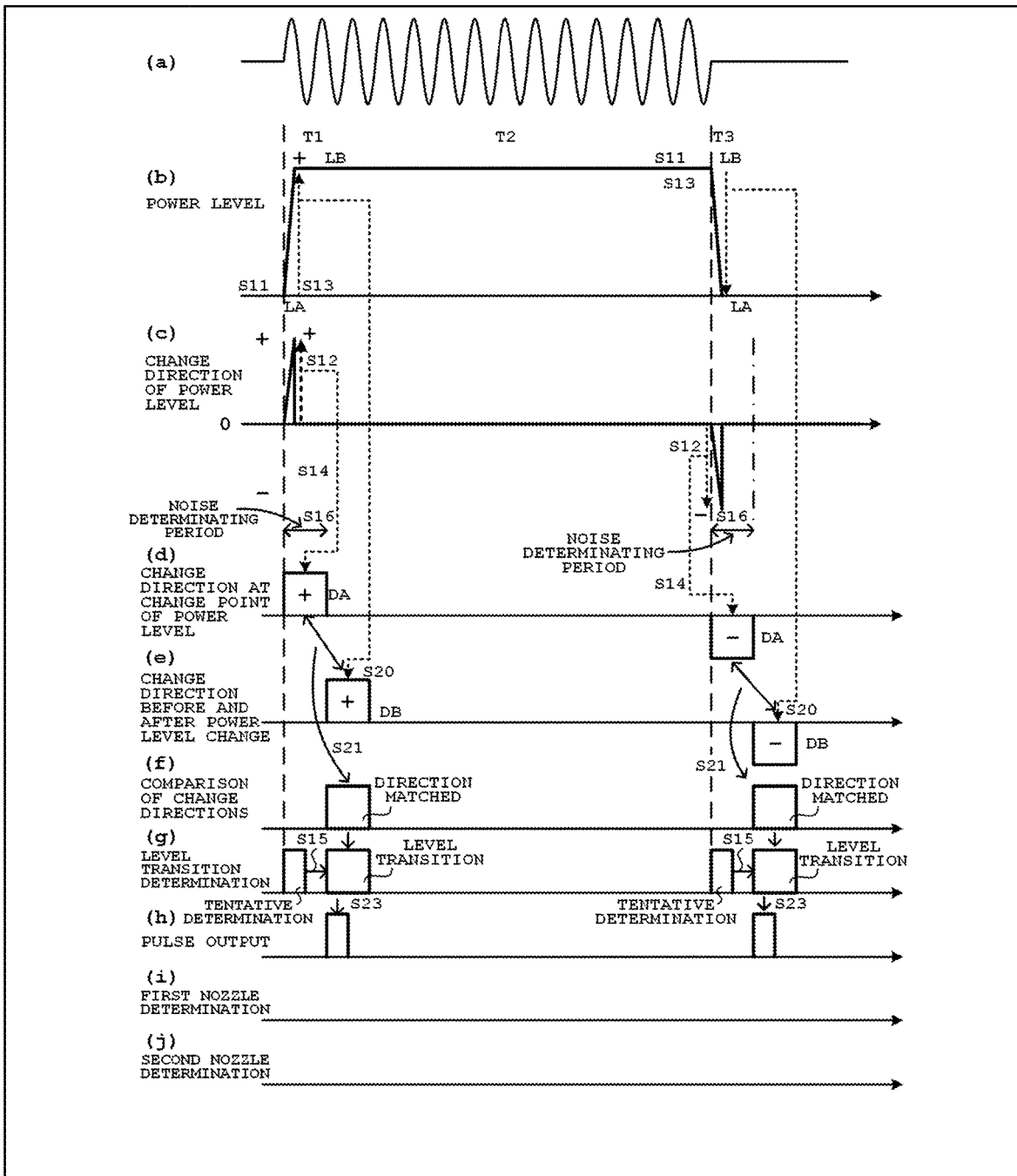
FIG. 12 is another signal diagram illustrating the operation examples of the power level detection circuit and the noise removing circuit of the pulsed high frequency monitor according to the invention.

Operation Examples of the power level change detection circuit 2 and the noise removing circuit 2a will be described with reference to a flow chart shown in FIG. 10 and signal diagrams shown in FIGS. 11 and 12. FIG. 11 shows an operation example of a power level that contains noise, and FIG. 12 shows an operation example of a power level that does not contain noise.

A power level obtained by the DC conversion circuit 1 is sampled in a sampling cycle having a predetermined period to detect a power level LA1 and a power level LA2 at two consecutive detection point A1 and detection point A2, respectively (S11). The power level fluctuation detection circuit 22 compares the power level LA1 with the power level LA2 to detect the presence of fluctuation between the power levels. This procedure is performed in such a way that the detection points A1 and A2 are sequentially repeated until fluctuation is detected between the power levels at two consecutive detection points A1 and A2 (S12).

If fluctuation is detected between the power levels in the procedure in S12, the power level LA1 is detected at the detection point A1 as the power level LA at the detection point A (S13).

Then, the change direction DA of the power level LA at the detection point A is detected. Since the occurrence of the fluctuation of the power level LA is detected at the detection point A in S13, the change direction DA of the power level LA is an increase direction or decrease direction (S14).

As the cause of the change in the power level at the detection point A includes the noise as well as real power level transition, the change in the power level at the detection point A is tentatively determined as power level transition (S15).

After the detection point A, fluctuation of the power level occurring during the predetermined noise determining period T (S16) is determined as noise and is removed, in which case it is determined that the fluctuation is not caused by the power level transition. The noise determining period T can be set arbitrary such that at least one cycle of possible noise includes a time width (S17). The procedures in S16 and S17 form a procedure of first noise removal.

After a lapse of the noise determining period T, a determination is made about whether there is fluctuation of the power level (S18), and when the fluctuation of the power level remains to be continued, the procedure goes back to S15 to determine the fluctuation of the power level as noise further in the noise determining period T so as to perform the first noise removal to remove the noise.

In the determination made in S18 when there is no fluctuation of the power level, the power level LB at the detection point B is detected. The detection point B can be a point at which the fluctuation of the power level is stopped in the noise determining period T in S16 and thus the final noise determining period T comes to an end (S19).

On the basis of a magnitude relationship between the power level LA at the detection point A detected in S13 and the power level LB at the detection point B detected in S19, the change direction DB of the power level between the detection points A and B is detected. When the power level LB at the detection point B is greater than the power level LA at the detection point A, an increase direction is detected as the change direction DB of the power level, when the power level LB at the detection point B is smaller than the power level LA at the detection point A, a decrease direction is detected as the change direction DB of the power level, and when the power level LB at the detection point B is equal to the power level LA at the detection point A, no-change is detected as the change direction DB of the power level. The detection of the above equality can be determined within a range including a margin portion arbitrarily set (S20).

The change direction DA of the power level at the detection point A detected in the procedure in S14 is compared with the change direction DB of the power level between the detection points A, B detected in the procedure in S20 (S21). If the comparison result shows that the change direction DA does not match the change direction DB, the power level transition tentatively determined in S15 is canceled, so that the power level at the detection point A is determined as noise (S22). The procedures in S14, S15, S21 and S22 form the procedure for a second noise removal.

If the comparison result in S21 shows that the change direction DA matches the change direction DB, the power level transition tentatively determined in S15 is confirmed to thereby determine the changes in the power level at the detection point A and the detection point B as power level transition (S23).

The determination about the power level transition/noise with respect to the combination of the change direction DA of the power level at the detection point A and the change direction DB of the power level between the detection point A and the detection point B is presented in Table 4 as below.

TABLE 4

| Change Direction DA of Power Level At Detection Point A | Change Direction DB of Power Level Between Detection Point A and Detection Point B | Determination on Power Level Transition/Noise |
| --- | --- | --- |
| Increase | Increase | Determined as power level transition |
|  | Decrease | Determined as noise |
|  | No Change | Determined as noise |
| Decrease | Increase | Determined as noise |
|  | Decrease | Determined as power level transition |
|  | No Change | Determined as noise |

(A) In the Case Where the Power Level Contains Noise:

The signal diagram in FIG. 11 schematically shows states of an operation when noise is generated, i.e. cases where the noise is generated at a rising edge T1 and a falling edge T3 of the power level as well as a steady state T2 where the power level is flat. More specifically, FIG. 11(a) shows a high frequency, FIG. 11(b) shows a power level, FIG. 11(c) shows a change direction of a power level, FIG. 11(d) shows a change direction of a power level at a time of power level change€IG. 11(e) shows change directions of a power level before and after fluctuation of the power level, FIG. 11(f) shows a result of comparison of the change direction in FIG. 11(d) with the change directio€n FIG. 11(e), FIG. 11(g) shows a determination about power level transition, FIG. 11(h) shows a pulse output, FIG. 11(i) shows a first noise determination performed during a noise period, and FIG. 11(j) shows a second noise determination performed in a steady state.

(a) Rising Edge T1 of the Power Level:

The power level at its rising edge T1 is LA (FIG. 11(b), S11), and the change direction DA of the power level at the time of rising of the power level is "+" (FIGS. 11(c), 11(d), S12). On the basis of the rising of the power level, the power level transition is tentatively determined to assume that the power level transition has occurred (FIG. 11(g), S15). In addition, when there is fluctuation of the power level between the time of rising of the power level and a pre-defined noise determining period T (FIG. 11(c), S16), the first noise determination is performed, provided that the noise has been generated (FIG. 11(i), S17).

If the power level is still changing after the lapse of the noise determining period T, the noise determination is also performed in the next noise determining period T as with the case in the last noise determining period T (FIG. 11(i), S17). After the lapse of the noise determining period T, at the end of the fluctuation of the power level (FIG. 11(b), S18), the power level LB is detected (FIG. 11(b), S19). FIG. 11(c) shows an example that the fluctuation of the power level ends at third noise determining period T.

In the comparison of the power level LA with the power level LB in FIG. 11(b), since the power level LB after fluctuation is greater than the power level LA before fluctuation, the change directions DB before and after the power level change beco€"+" (FIG. 11(e), S20).

The change direction DA at the time of the power level change (FIG. 11(d)) is compared with the change directions DB before and after the power lev€ change (FIG. 11(e)) (FIG. 11(f), S21). Since both of the change direction DA and the change direction DB are "+" and the change directions match each other, the tentative determination is updated to true determination to determine that the power level transition has occurred (FIG. 11(g), S23), thereby generating a pulse output (FIG. 11(h)).

(b) Steady State T2 Where the Power Level is Flat:

At a period during which the power level is in the steady state, the power level is LB (FIG. 11(b), S11), and the change direction DA of the power level when the power level fluctuates is "+" (FIGS. 11(c), 11(d), S12). Based on this power level fluctuation, the power level transition is tentatively determined to assume that the power level transition has occurred (FIG. 11(g), S15). In addition, when there is fluctuation of the power level between the time of rising of the power level and a predefined noise determining period T (FIG. 11(c), S16), the first noise determination is performed, provided that the noise has been generated (FIG. 11 (h), S17).

At the end of the fluctuation of the power level after the lapse of the noise determining period T (FIG. 11(b), S18), the power level LB is detected (FIG. 11(b), S19). In the comparison of the power level LB before and after the steady state T2 with the power level LB in FIG. 11(b), the change directions DB before and after the change in the power level is "±0" because the power leve€are equal (FIG. 11(e), S20).

The change direction DA at the time of the power level change (FIG. 11(d)) is compared with the change directions DB before and after the pow€level change (FIG. 11(e)) (FIG. 11(f), S21). In this case, the change direction DA is "+" and the change direction DB is "±0", and since the change directions do not match each other, the tentative determination is canceled to thereby determine that the power level transition did not occur (FIG. 11(g), S23), and thus no pulse output is generated (FIG. 11(h)). In addition to that, based on the result that the change directions did not match (FIG. 11(f), S22), a second noise determination is performed, provided that the power level change is noise (€. 11(j), S22).

(c) Falling Edge T3 of the Power Level: At the falling edge T3 of the power level, the power level changes from LB toward LA (FIG. 11(b), S11), and the change direction DA of the power level at a time of falling of the power level becomes "−" (minus) (FIGS. 11(c), 11(d), S12). On the basis of the falling of the power level, the power level transition is tentatively determined to assume that the power level transition has occurred (FIG. 11(g), S15). In addition, the first noise determination is performed, provided that the noise has been generated between the time of falling of the power level and a predefined noise determining period T (FIG. 11(c), S16) (FIG. 11(i), S17).

At the end of the fluctuation of the power level after the lapse of the noise determining period T (FIG. 11(b), S18), the power level LA is detected (FIG. 11(b), S19). In the comparison of the power level LB with the power level LA in FIG. 11(b), since the power level LA after the fluctuation is smaller than the power level LB before the fluctuation, the change directions DB before and after the power level chan€become "−" (minus) (FIG. 11(e), S20).

The change direction DA at the time of the power level change (FIG. 11(d)) is compared with the change directions DB before and after the time o€he power level change (FIG. 11(e)) (FIG. 11(f), S21). Since both of the change direction DA and the change direction DB are "−" (minus) and the change directions match each other, the tentative determination is updated to true determination to determine that the power level transition has occurred (FIG. 11(g), S23), thereby generating a pulse output (FIG. 11(h)).

(B) In the Case Where the Power Level Does Not Include Noise:

A signal diagram in FIG. 12 schematically shows states of an operation when no noise is generated, i.e. cases where the noise is not generated at a rising edge T1 and a falling edge T3 of the power level as well as a steady state T2 where the power level is flat. More specifically, FIG. 12(a) shows a high frequency, FIG. 12(b) shows a power level, FIG. 12(c) shows a change direction of a power level, FIG. 12(d) shows a change direction of a power level at a time of th€hange in the power level, FIG. 12(e) shows change directions of a power level before and after fluctuation of the power level, FIG. 12(f) shows a result of comparison of the change direction in FIG. 12 (€with the change direction in FIG. 12(e), FIG. 12(g) shows a determination about power level transition, FIG. 12(h) shows a pulse output, FIG. 12(i) shows a first noise determination performed during a noise period, and FIG. 12(j) shows a second noise determination performed in a steady state.

(a) Rising edge T1 of the Power Level:

The power level at the rising edge T1 of the power level is LA (FIG. 12(b), S11), and a change direction DA of the power level at the time of rising of the power level is "+" (FIGS. 12(c), 12(d), S12). On the basis of the rising of the power level, the power level transition is tentatively determined to assume that the power level transition has occurred (FIG. 12(g), S15). In addition, when there is no change in the power level between the time of rising of the power level and a predefined noise determining period T (FIG. 12(c), S16), the first noise determination is not performed, provided that the noise is not generated (FIG. 12(i)).

After the lapse of the noise determining period T, a power level LB is detected (FIG. 12(b), S13). In the comparison of the power level LA with the power level LB in FIG. 12(b), since the power level LB after the rising of the power level is greater than the power level LA before the rising, the change directions DB before and after € power level change become "+" (FIG. 12(e), S20).

The change direction DA at the time of rising of the power level (FIG. 12(d)) is compared with the change directions DB before and€ter the rising of the power level (FIG. 12(e)) (FIG. 12(f), S21). Since both of the change direction DA and the change direction DB are "+" and the change directions match each other, the tentative determination is updated to true determination to determine that the power level transition has occurred (FIG. 12(g), S23), thereby generating a pulse output (FIG. 12(h)).

(b) Steady State T2 Where the Power Level is Flat:

At a period during which the power level is in the steady state, as the power remains at the level LB with no fluctuation, none of the first noise determination, the second noise determination or the€wer level transition are performed.

(c) Falling Edge T3 of the Power Level:

At the time of falling edge T3 of the power level, the power level changes from LB to LA (FIG. 12(b), S11), and the change direction DA of the power level at a time of falling of the power level becomes "−" (minus) (FIGS. 12(c), 12(d), S12). On the basis of the falling of the power level, the power level transition is tentatively determined to assume that the power level transition has occurred (FIG. 12(g), S15).

If there is no fluctuation of the power level between the time point of falling of the power level and€e predefined noise determining period T (FIG. 12(c), S16), the first noise determination is not performed, provided that the noise is not generated (FIG. 12(i)).

In the comparison of the power level LB with the power level LA in FIG. 12(b), since the power level LA after the fluctuation is smaller than the power level LB before the fluctuation, the change directions DB before and af€ the power level change become "−" (minus) (FIG. 12(e), S20).

The change direction DA at the point of time of the power level change (FIG. 12(d)) is compared with the change direc€ns DB before and after the power level change (FIG. 12(e)) (FIG. 12(f), S21). Since both of the change direction DA and the change direction DB are "−" (minus) and the change directions match each other, the tentative determination is updated to true determination to determine that the power level transition has occurred (FIG. 12(g), S23), thereby generating a pulse output (FIG. 12(h)).

If there is no fluctuation of the power level between the point of time of falling of the power €el and the predefined noise determining period T (FIG. 12(c), S16), the first noise determination is not performed, provided that the noise is not generated (FIG. 12(h)).

Second Configuration of Pulsed High Frequency Monitor

The second configuration of a pulsed high frequency monitor is for monitoring a transition pattern based on a time-series pattern of transition order in magnitude of a power level.

(Example of Second Configuration)

Figure 13:
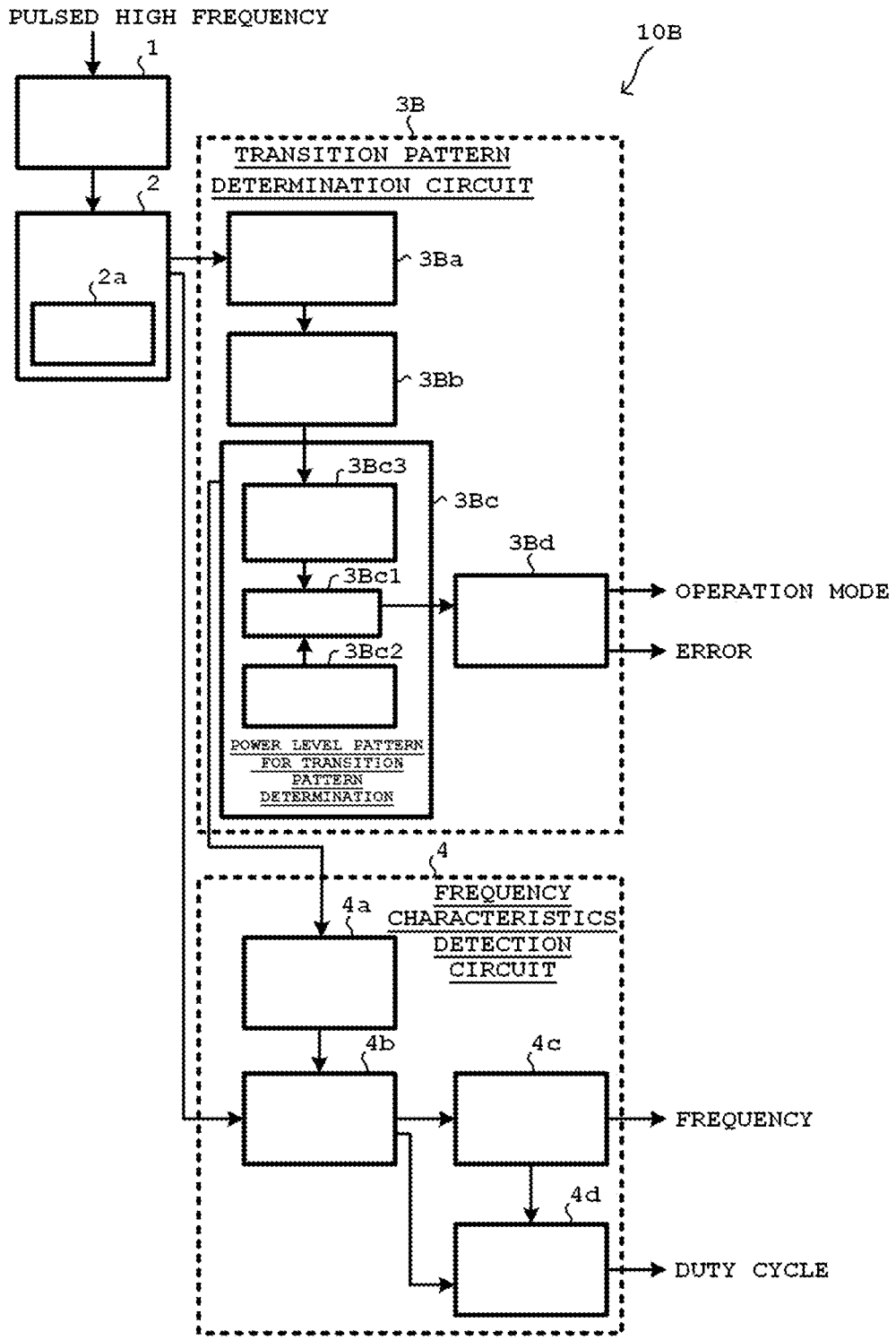
FIG. 13 illustrates an outline of an example of a second configuration of the pulsed high frequency monitor according to the invention.

A description will be made about an outline of an example of the second configuration by referring to FIG. 13.

A pulsed high frequency monitor 10B comprises a DC conversion circuit 1 that outputs a power level obtained by converting a pulsed high frequency into a DC, a power level change detection circuit 2 that detects a change in the power level, a transition pattern determination circuit 3B that determines a transition pattern of the power level in a time series on the basis of the change in the level detected by the power level change detection circuit 2, and a frequency characteristics detection circuit 4 that detects frequency characteristics of a pulsed high frequency. Noise contained in the power level during the DC conversion by the DC conversion circuit 1 is removed by a noise removing circuit 2a provided to the power level change detection circuit 2.

The transition pattern determination circuit 3B determines a transition pattern of the power level in the time series based on a time-series pattern of transition order in magnitude of the power level, thereby outputting an operation mode that represents a type of the pulsed high frequency based on the transition pattern thus determined. In this context, the transition order in the magnitude of the power level is not an absolute value of magnitude of the power level itself, but is a pattern time series of the order in which the magnitude of a changing level changes when the power level increases or decreases.

For example, if the power has two levels of an ON state and an OFF state (ON/OFF), a transition pattern comprises a pattern of a transition order in a time series in which magnitude of a power level changes from small to large in the change of the magnitude of the power level from a low level in the OFF state to a high level in the ON state. If the power has two levels of a High state in which the power level is high and a Low state in which the power level is low (High/Low), the transition pattern comprises a pattern of a transition order in a time series in which the magnitude of a power level changes from small to large in a case of the change of the magnitude of the power level from a low level in the Low state to a high level in the High state. In the case of two levels, the transition order in the time series in which the magnitude changes from large to small and a transition order in a time series in which magnitude changes from small to large have the same transition pattern due to periodicity.

Furthermore, if the power has three levels of the High state in which the power level is high, the Low state in which the power level is low and the OFF state in which there is no power level (High/Low/OFF), a transition pattern of a power level comprises a time-series pattern of a transition order in which the magnitude of the power level changes from an OFF level to a High level, from the High level to a Low level and from the Low level to the OFF level in a case of the change in the magnitude of the power level from the OFF level in the OFF state to the High level in the High state, from the High level in the High state to the Low level in the Low state, and from the Low level in the Low state to the OFF level in the OFF state, and a time-series pattern of a transition order in which the magnitude of the power level changes from the OFF level to the Low level, from the Low level to the High level and from the High level to the OFF level in a case of the change in the magnitude of the power level from the OFF level in the OFF state to the Low level in the Low state, from the Low level in the Low state to the High level in the High state, and from the High level in the High state to the OFF level in the OFF state.

The transition pattern determination circuit 3B comprises a transition level detection circuit 3Ba, a transition level time-series memory circuit 3Bb, a power level transition pattern determination circuit 3Bc and an operation mode encoder 3Bd.

The transition level detection circuit 3Ba detects magnitude of the power level based on a change in the power level detected by the power level change detection circuit 2. The detection of the magnitude of the power level is performed by comparing relative magnitude of the power level, not depending on an absolute value of the power level. The relative comparison is performed for comparing the detected magnitude of the power level, and thus does not need to use a threshold value for the comparison.

The transition level time-series memory circuit 3Bb stores in a time series the magnitude of the power level detected by the transition level detection circuit 3Ba.

The power level transition pattern determination circuit 3Bc comprises a comparison circuit 3Bc1 to compare a transition level time-series pattern of a change in the power level in one cycle among transition level time-series patterns stored in the transition level time-series memory circuit 3Bb with a transition level pattern for transition pattern determination 3Bc2, so as to determine a type of a transition level pattern. A transition level time-series pattern for one cycle can be extracted by a period pattern determination circuit 3Bc3. The period pattern determination circuit 3Bc3 extracts a pattern for one cycle from successive transition level time series stored in the transition level time-series memory circuit 3Bb.

As transition level pattern for transition pattern determination 3Bc2, time-series patterns of a transition level, in which a power level changes at two levels, three levels, four levels and so on, are stored. The number of the transition level patterns for transition pattern determination is ${}_{n-1}C_1 \times {}_{n-2}C_1 \times \ldots \times {}_1C_1$ when the power has n-levels. For example, when the power has two levels, the number of patterns is ${}_1C_1=1$, when the power has three levels, the number of patterns is ${}_2C_1 \times {}_1C_1=2$, when the power has four levels, the number of patterns is ${}_3C_1 \times {}_2C_1 \times {}_1C_1=6$, and when the power has five levels, the number of patterns is ${}_4C_1 \times {}_3C_1 \times {}_2C_1 \times {}_1C_1=24$. The transition pattern determination circuit 3B compares a time-series pattern of a transition level of a power level with the transition direction pattern for transition pattern determination 3Bc2 as an index.

An operation mode of a pulsed high frequency corresponds to a time-series pattern in a transition direction. For example, a pattern repeating increase and decrease in a transition direction corresponds to an operation mode in which the pulsed high frequency repeats two levels of the ON state and the OFF state or the Low state and the High state. A pattern repeating increase twice and decrease once in the transition direction, or repeating increase once and decrease twice corresponds to an operation mode in which the pulsed high frequency repeats the transition at three levels in the order of the OFF state, the Low state and the High state, or an operation mode in which the pulsed high frequency repeats the transition at three levels in the order of the High state, the Low state and the OFF state. The operation mode encoder 3Bd determines an operation mode of the pulsed high frequency based on a transition direction pattern determined by the power level transition pattern determination circuit 3Bc. In the case where a time-series pattern in a transition direction does not match the transition direction pattern for transition pattern determination or operation pattern, the time-series pattern is considered as an error.

The frequency characteristics detection circuit 4 comprises the period detection circuit 4a, a time measuring circuit 4b, a frequency detection circuit 4c and a duty cycle detection circuit 4d, in order to detect a frequency of a pulse waveform and a duty cycle of the pulse waveform of a pulsed high frequency based on a power level change.

The period detection circuit 4a determines periodicity of a transition level detected by the period pattern determination circuit 3Bc3. In the periodicity determination, the periodicity can be determined on the basis of the transition level pattern in which the power levels are put in a time series.

A transition level pattern in a long period may have a transition level pattern in a short period. Thus, the period detection circuit 4a defines the longest period for detecting periods, and at first determines the transition level pattern in a long period, thereby determining about the periodicity of the transition level to detect a period.

The time measuring circuit 4b measures a time width of the period detected by the period detection circuit 4a and a time width of the power level change detected by the power level change detection circuit 2.

The frequency detection circuit 4c detects a frequency of the pulsed high frequency based on the time width of the period measured by the time measuring circuit 4b.

The duty cycle detection circuit 4d detects a duty cycle of a pulse waveform of the pulsed high frequency based on the time width of the period and the time width of the power level change measured by the time measuring circuit 4b.

(Operation Example of Second Configuration)

Figure 14:
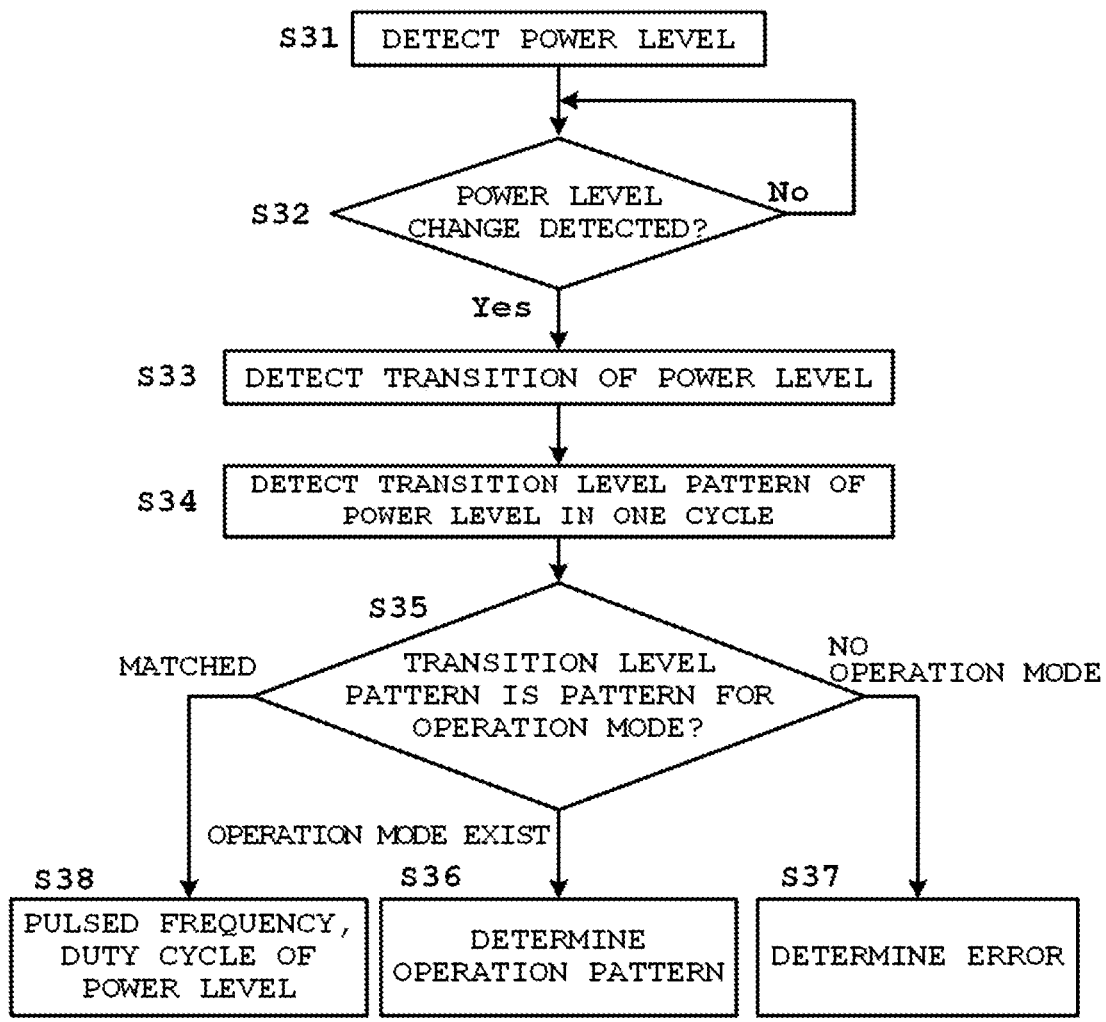
FIG. 14 is a flowchart illustrating an operation example of a second configuration of the pulsed high frequency monitor according to the invention.
Figure 15:
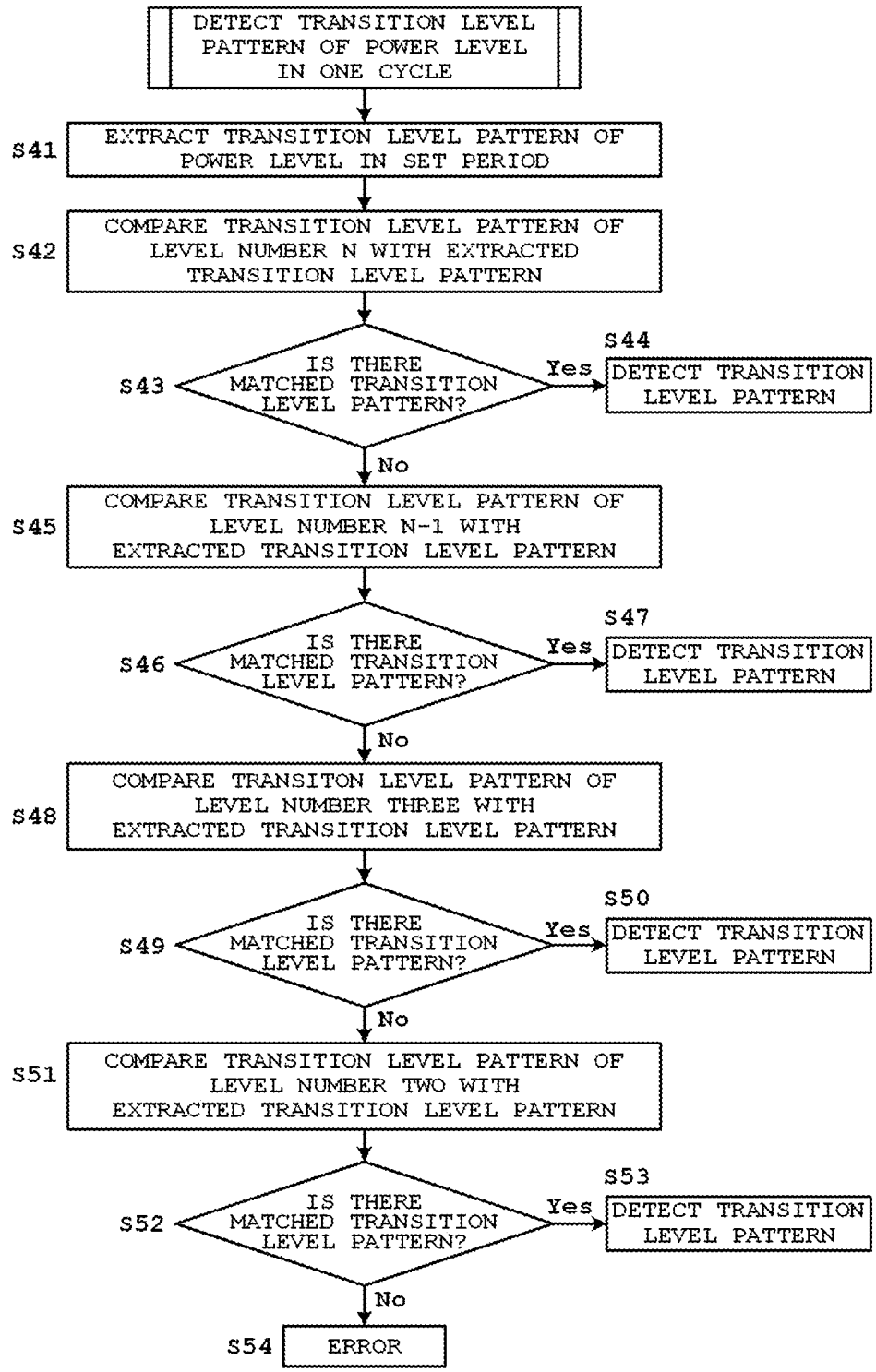
FIG. 15 is a flowchart illustrating another operation example of the second configuration of the pulsed high frequency monitor according to the invention.

Operation examples of the second configuration will be described with reference to flowcharts of FIGS. 14 and 15. The flowchart in FIG. 15 shows a flow for detecting a transition pattern of a power level in one cycle.

The DC conversion circuit 1 converts a pulsed high frequency into a DC to detect a power level (S31). The power level change detection circuit 2 detects a change in a level of electric power of the detected power level (S32). On the basis of the periodicity of the transition of the change in the level of the electric power thus detected, the transition pattern determination circuit 3B determines an operation mode of the pulsed high frequency, and the frequency characteristics detection circuit 4 detects a frequency and/or a duty cycle of the pulsed high frequency.

The transition level detection circuit 3Ba detects a transition state of the power level, and the transition level time-series memory circuit 3Bb stores in a time series a transition level detected by the transition level detection circuit 3Ba (S33).

In the power level transition pattern determination circuit 3Bc, the period pattern determination circuit 3Bc3 detects a transition level pattern of a power level in one cycle based on the time series data on the transition level stored in the transition level time-series memory circuit 3Bb. The detection of the transition level pattern of the power level in one cycle (S34) will be described with reference to the flowchart in FIG. 15.

The comparison circuit 3Bc1 compares extracted transition level patterns with the transition level pattern for transition pattern determination to thereby detect a transition level pattern that matches the transition level pattern for transition pattern determination (S35). The operation mode encoder 3Bd determines whether or not there is an operation mode that corresponds to the detected transition level pattern, and when there is a corresponding operation mode, then outputs the concerned operation mode (S36), or when there is no corresponding operation mode, considers the detected pattern as an error (S37).

The period detection circuit 4a detects one period of a transition pattern from the periodicity in the transition state of the power level based on the result of the period determination performed by the period pattern determination circuit 3Bc3. In the frequency characteristics detection circuit 4, the time measuring circuit 4b measures time widths of an ON period and an OFF period of a pulse for one period of the transition pattern detected by the period detection circuit 4a. The frequency detection circuit 4c detects a frequency based on the time widths for one period of the transition pattern, and the duty cycle detection circuit 4d detects a duty cycle based on the time widths of the ON period and the OFF period of the pulse (S38).

(Detection of Transition Level Pattern of Power Level in One Cycle)

The detection of a transition level pattern of the power level in one cycle is performed in descending order of the number of the transition levels.

In the flowchart in FIG. 15, the maximum level number of the transition level pattern is preset. If the magnitude of transition levels is different from one another, the maximum level number is set to be N, so that the length of a period of the transition level pattern is defined (S41). The comparison circuit 3Bc1 compares the transition pattern extracted by the period pattern determination circuit 3Bc3 with transition level patterns for transition pattern determination of level number N (S42). In the comparison of the transition patterns, when a transition level pattern for transition pattern determination matching the extracted transition pattern is detected (S43), the concerned transition level pattern for transition pattern determination is output as a transition pattern (S44).

In the comparison of the transition patterns, when a transition level pattern for transition pattern determination matching the extracted transition pattern is not detected, the extracted transition pattern is compared with transition level patterns for transition pattern determination of level number (N-1) (S45). In the comparison of the transition patterns, when a transition level pattern for transition pattern determination matching the extracted transition pattern is detected (S46), the concerned transition level pattern for transition pattern determination is output as a transition pattern (S47).

Thus, the comparison of the transition patterns is continued until a transition level pattern for transition pattern determination matching the extracted transition pattern is detected. Below is a description about the cases that the level number is three or more.

The extracted transition pattern is compared with transition level patterns for transition pattern determination of level number three (S48). In the comparison of the transition patterns, when a transition level pattern for transition pattern determination matching the extracted transition pattern is detected (S49), the concerned transition level pattern for transition pattern determination is output as a transition pattern (S50).

In the comparison of the transition patterns, when a transition level pattern for transition pattern determination matching the extracted transition pattern is not detected, the extracted transition pattern is compared with transition level patterns for transition pattern determination of level number two (S51). In the comparison of the transition patterns, when a transition level pattern for transition pattern determination matching the extracted transition pattern is detected (S52), the concerned transition level pattern for transition pattern determination is output as a transition pattern (S53). In the comparison of the transition patterns, when a transition level pattern for transition pattern determination matching the extracted transition pattern is not detected, the extracted pattern is considered as an error (S54).

Now, a description will be made about operation examples at two, three and four power levels.

In here, the magnitude of the transition levels is different from one another.

Figure 16:
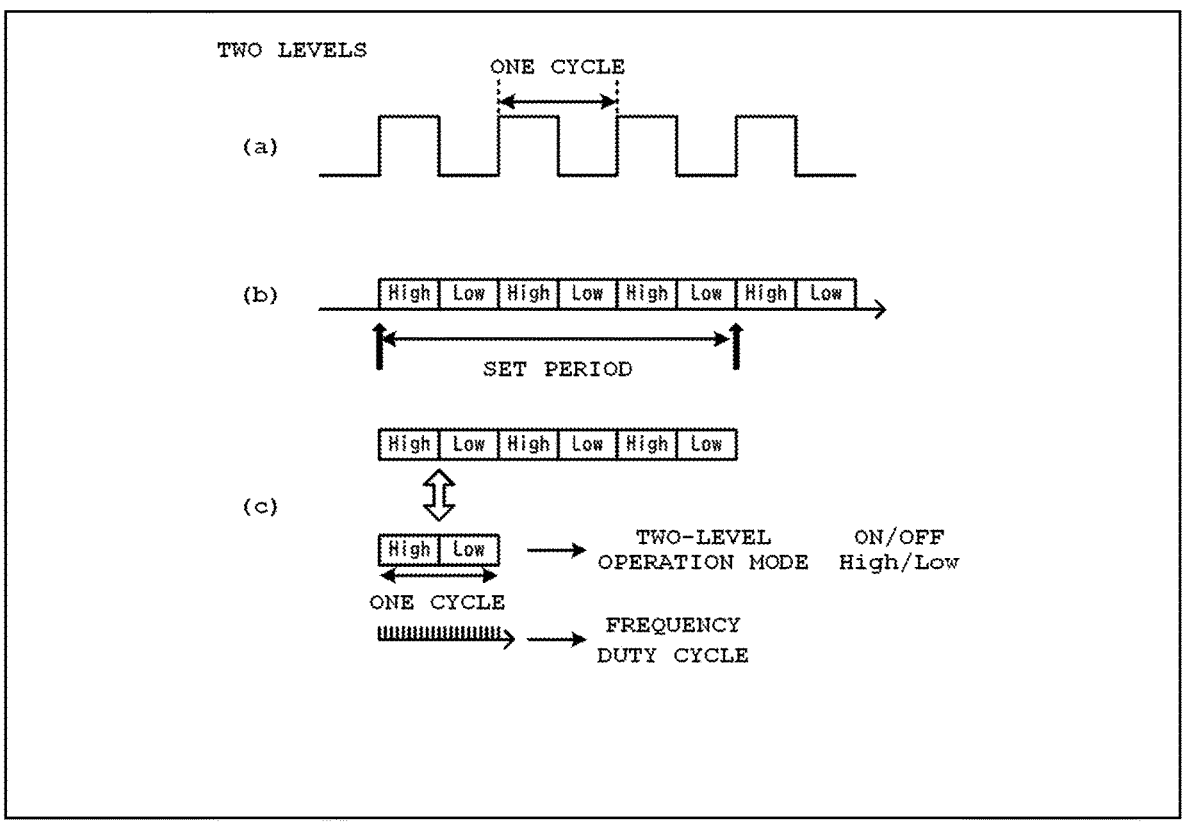
FIG. 16 illustrates operation examples at two levels of the second configuration of the pulsed high frequency monitor according to the invention.

(1) Operation Example at Two Levels:

The operation example at two levels will be described by referring to FIG. 16. DC conversion is performed on a pulsed high frequency of two levels, at which an ON state and an OFF state are repeated or a high-frequency period and a no-output period are repeated, so as to obtain a rectangular wave signal that repeats high and low voltage levels (FIG. 16(a)). The high and low voltage levels are compared to each other to obtain a transition level pattern that repeats (High) and (Low) (FIG. 16(b)). From the transition level pattern with consecutive (High/Low), a transition level pattern of a preset period is extracted and compared with the transition level pattern of two levels (High/Low) (FIG. 16(c)). In light of periodicity, the number of transition level patterns with n-power levels can be presented as $_{n-1}C_1 \times _{n-2}C_1 \times \ldots \times _1C_1$, and thus when the levels are two, the number of transition level patterns is $_1C_1=1$.

The comparison enables an extraction of a two-level operation mode from a matched transition level pattern of two levels (High/Low). Table 5 shows a relationship between power level transition in the previous cycle of the two-level operation mode and the operation mode.

TABLE 5

| Power Level Transition in Previous Cycle | | Operation Mode |
| --- | --- | --- |
| No. 1 | No. 2 | Determination |
| High | Low | Two Levels (ON/OFF) (High/Low) |
| Low | High | |

(2) Operation Example at Three Levels:

The operation example at three levels will be described with reference to FIG. 17.

Figure 17:
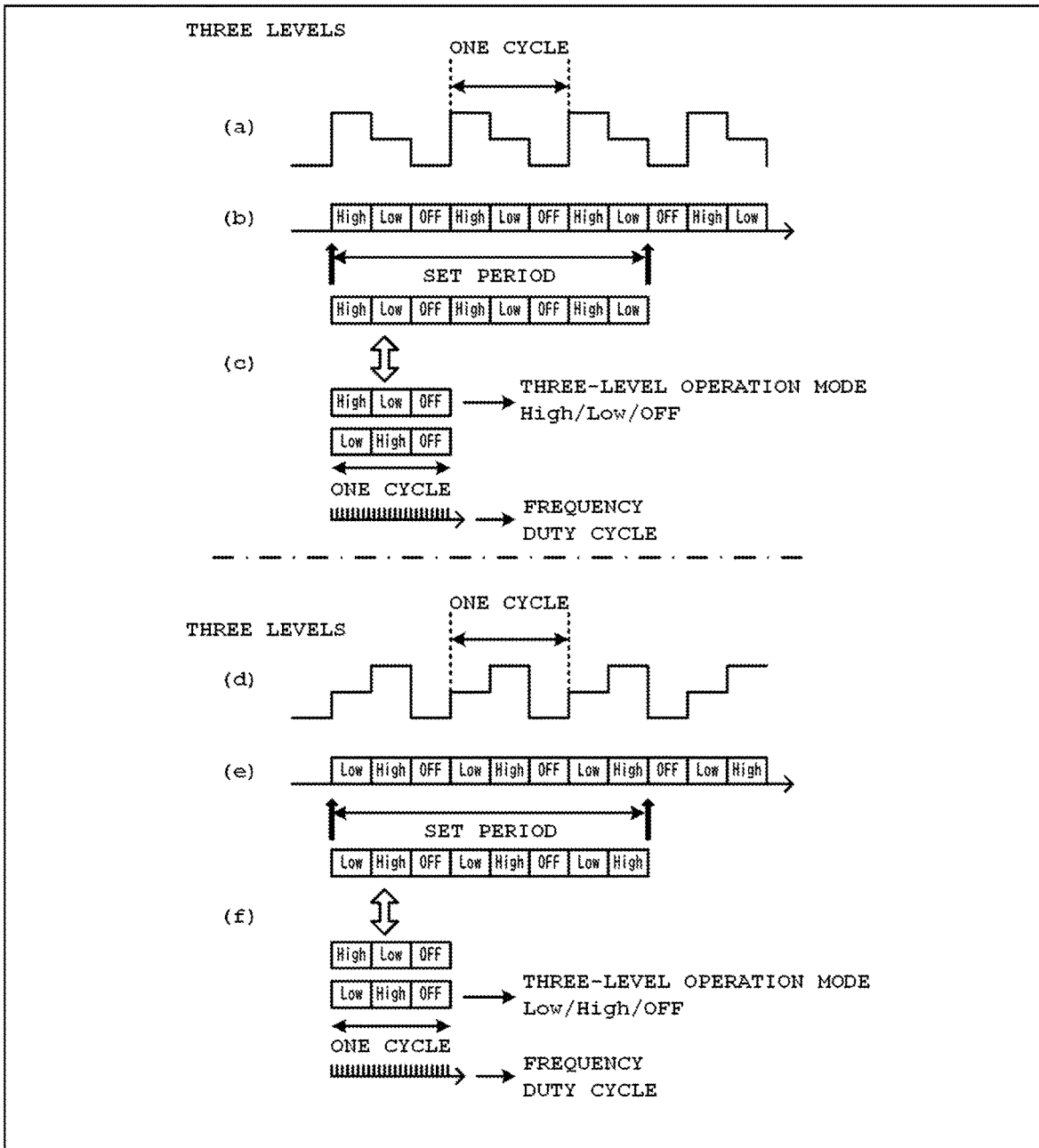
FIG. 17 illustrates operation examples at three levels of the second configuration of the pulsed high frequency monitor according to the invention.
Figure 18:
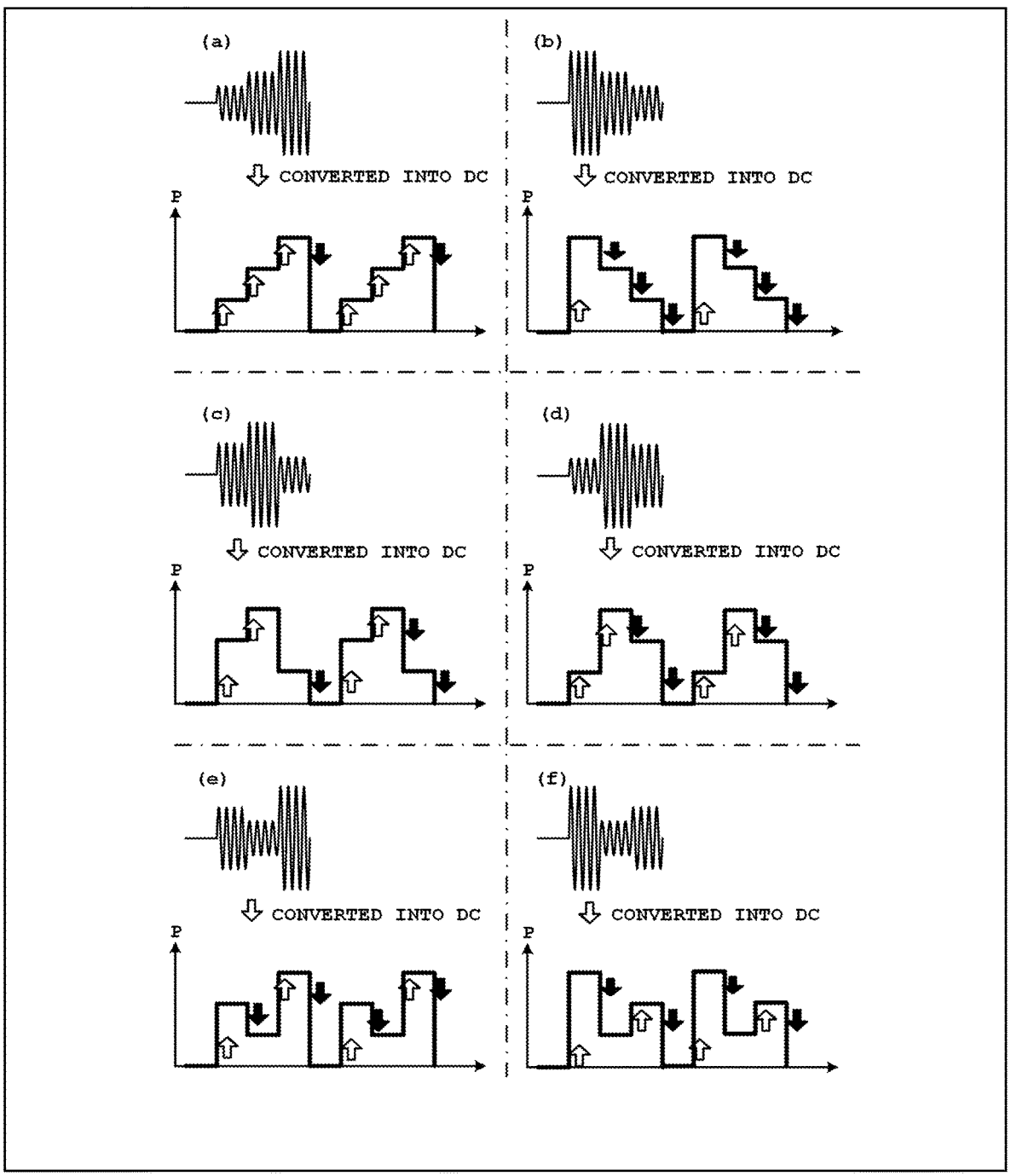
FIG. 18 illustrates operation examples at four levels of the second configuration of the pulsed high frequency monitor according to the invention.

FIG. 17 shows operation examples of extracting an operation mode from transition level patterns at three levels. FIGS. 17(a) to 17(c) show examples of a transition level pattern in a High state, a Low state and an OFF state, and FIGS. 17(d) to 17(f) show examples of a transition level pattern in the Low state, the High state, and the OFF state. When power has three levels, in the light of periodicity the number of transition level patterns is $_2C_1 \times _1C_1=2$.

The examples of FIGS. 17(a) to 17(c) show that, in a rectangular wave signal obtained by converting a pulsed high frequency into a DC (FIG. 17(a)), voltage levels in a High state, a Low state and an OFF state are compared to one another to thereby obtain a transition level pattern repeating (High), (Low) and (OFF) (FIG. 17(b)). From the transition level pattern of consecutive (High/Low/OFF), a transition level pattern of a preset period is extracted and compared with the transition level pattern of three levels (High/Low/OFF).

The comparison enables an extraction of a three-level operation mode from a matched transition level pattern of three levels (High/Low/OFF).

The examples of FIGS. 17(d) to 17(f) show that, in a rectangular wave signal obtained by converting a pulsed high frequency into a DC (FIG. 17(d)), voltage levels in a Low state, a High state and an OFF state are compared to one another to thereby obtain a transition level pattern repeating (Low), (High) and (OFF) (FIG. 17(e)). From the transition level pattern of consecutive (Low/High/OFF), a transition level pattern of a preset period is extracted and compared with the transition level pattern of three levels (Low/High/OFF).

The comparison enables an extraction of a three-level operation mode from a matched transition level pattern of three levels (Low/High/OFF). Table 6 shows a relationship between power level transition in the previous cycle of the three-level operation mode and the operation mode.

TABLE 6

| Power Level Transition in Previous Cycle | | | Operation Mode |
| --- | --- | --- | --- |
| No. 1 | No. 2 | No. 3 | Determination |
| High | Low | OFF | Three Levels (High/Low/OFF) |

TABLE 6-continued

| Power Level Transition in Previous Cycle | | | Operation Mode |
| --- | --- | --- | --- |
| No. 1 | No. 2 | No. 3 | Determination |
| Low | High | OFF | Three Levels (Low/High/OFF) |

(3) Operation Example at Four Levels:

The operation example at four levels will be described by referring to FIGS. 18 to 21. In light of periodicity, the number of transition level patterns of n-power levels can be presented as $_{n-1}C_1 \times _{n-2}C_1 \times \ldots \times _1C_1$, and thus when the levels are four, the number of transition level patterns is $_3C_1 \times _2C_1 \times _1C_1=6$.

FIG. 18(a) shows an example of repeating four levels, in which a power level increases in the sequence of a first High state, a second High state and a third High state, and then decreases to a Low state or OFF state. FIG. 18(b) shows an example of repeating four levels, in which a power level increases from the Low state or OFF state and then decreases in the order of the third High state, the second High state to the first High state.

The transition level pattern in FIG. 18(a) and the transition level pattern in FIG. 18(b) are on a rising edge (UP) and a falling edge (DOWN), respectively, and their transition direction patterns are different from each other. Thus, the transition patterns can be determined.

FIG. 18(c) shows an example of repeating four levels, in which a power level increases to the first High state and to the third High state, then decreases to the second High state and further to the Low state or OFF state. FIG. 18(d) shows an example of repeating four levels, in which a power level increases to the second High state and to the third High state, and then decreases to the first High state and to the Low state or OFF state.

The transition level pattern in FIG. 18(c) and the transition level pattern in FIG. 18(d) respectively on the rising edge (UP) and the falling edge (DOWN) are in the same transition direction. Thus, the transition direction patterns cannot be used for determining a transition pattern. However, since the transition level patterns are different from each other, the transition patterns can be determined.

FIG. 18(e) shows an example of repeating four levels, in which a power level increases to the second High state and then decreases to the first High state, and after increasing to the third High state, decreases to the Low state or OFF state. FIG. 18(f) shows an example of repeating the four levels, in which a power level increases to the first High state and then decreases to the first High state, and after increasing to the second High state, decreases to the Low state or OFF state.

The transition level pattern in FIG. 18(e) and the transition level pattern in FIG. 18(f) respectively on the rising edge (UP) and the falling edge (DOWN) are in the same transition direction. Thus, the transition direction patterns cannot be used for determining the transition patterns. However, since the transition level patterns are different from each other, the transition patterns can be determined.

Figure 19:
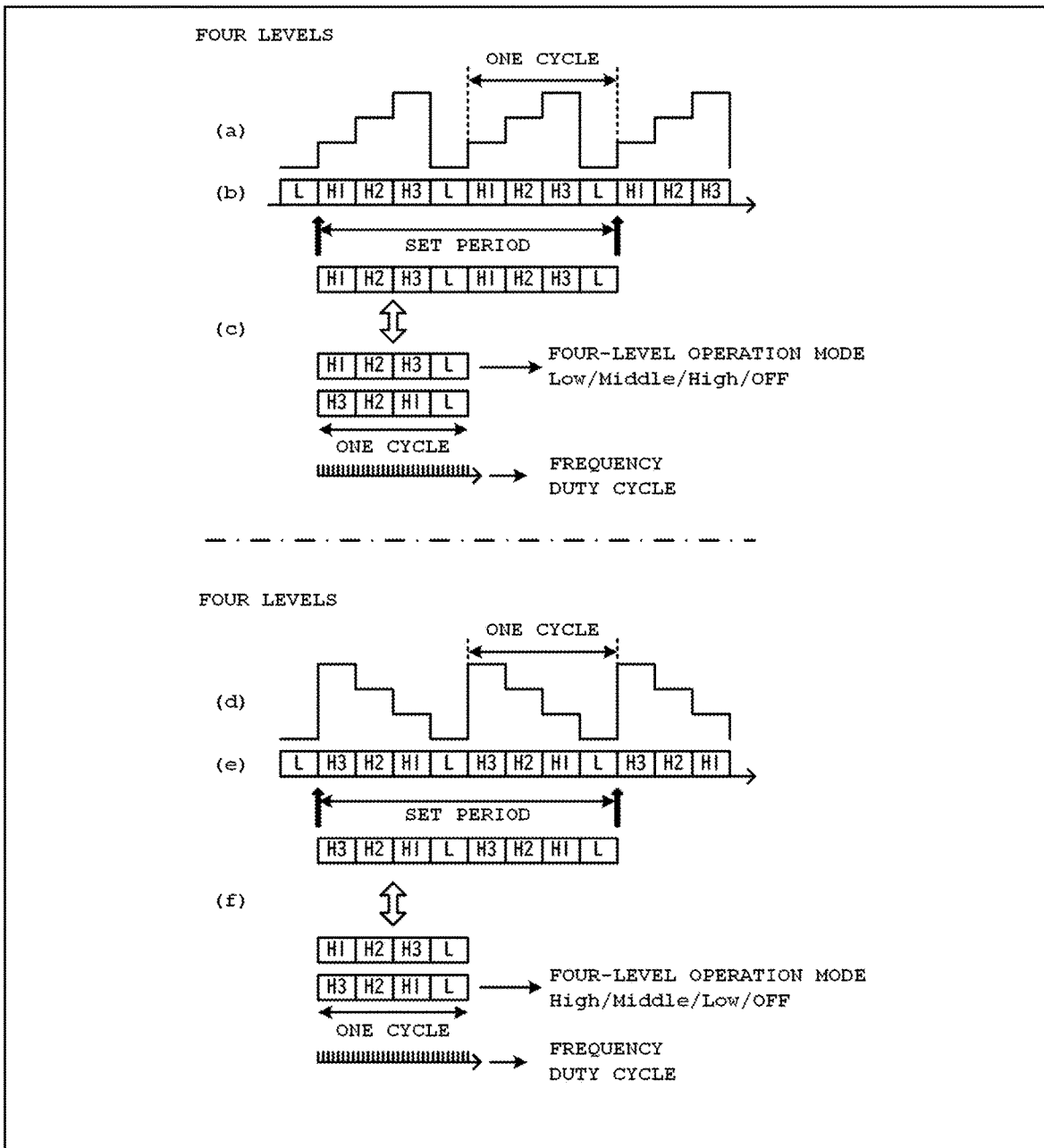
FIG. 19 illustrates the operation examples at four levels of the second configuration of the pulsed high frequency monitor according to the invention.
Figure 20:
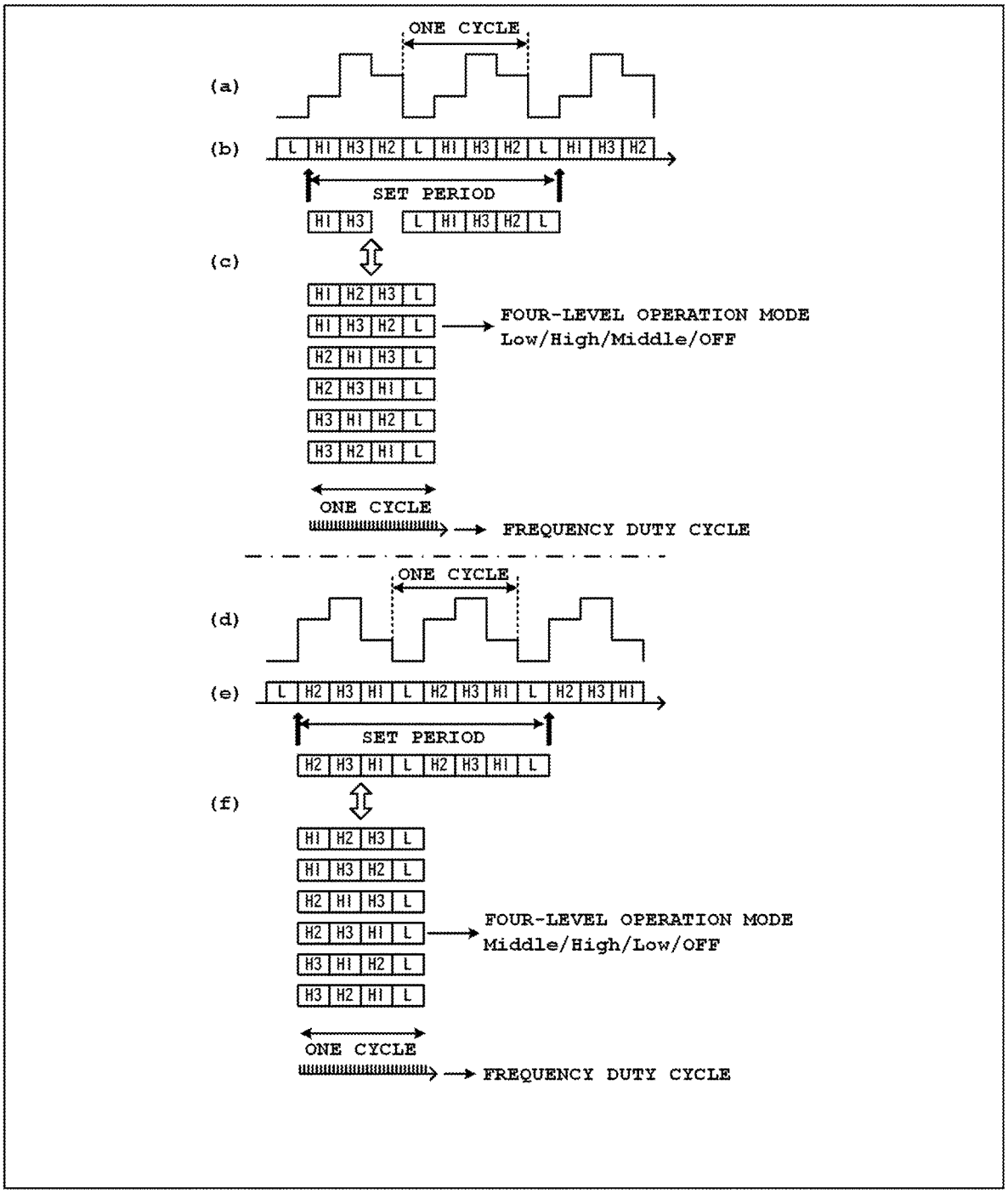
FIG. 20 illustrates the operation examples at four levels of the second configuration of the pulsed high frequency monitor according to the invention.
Figure 21:
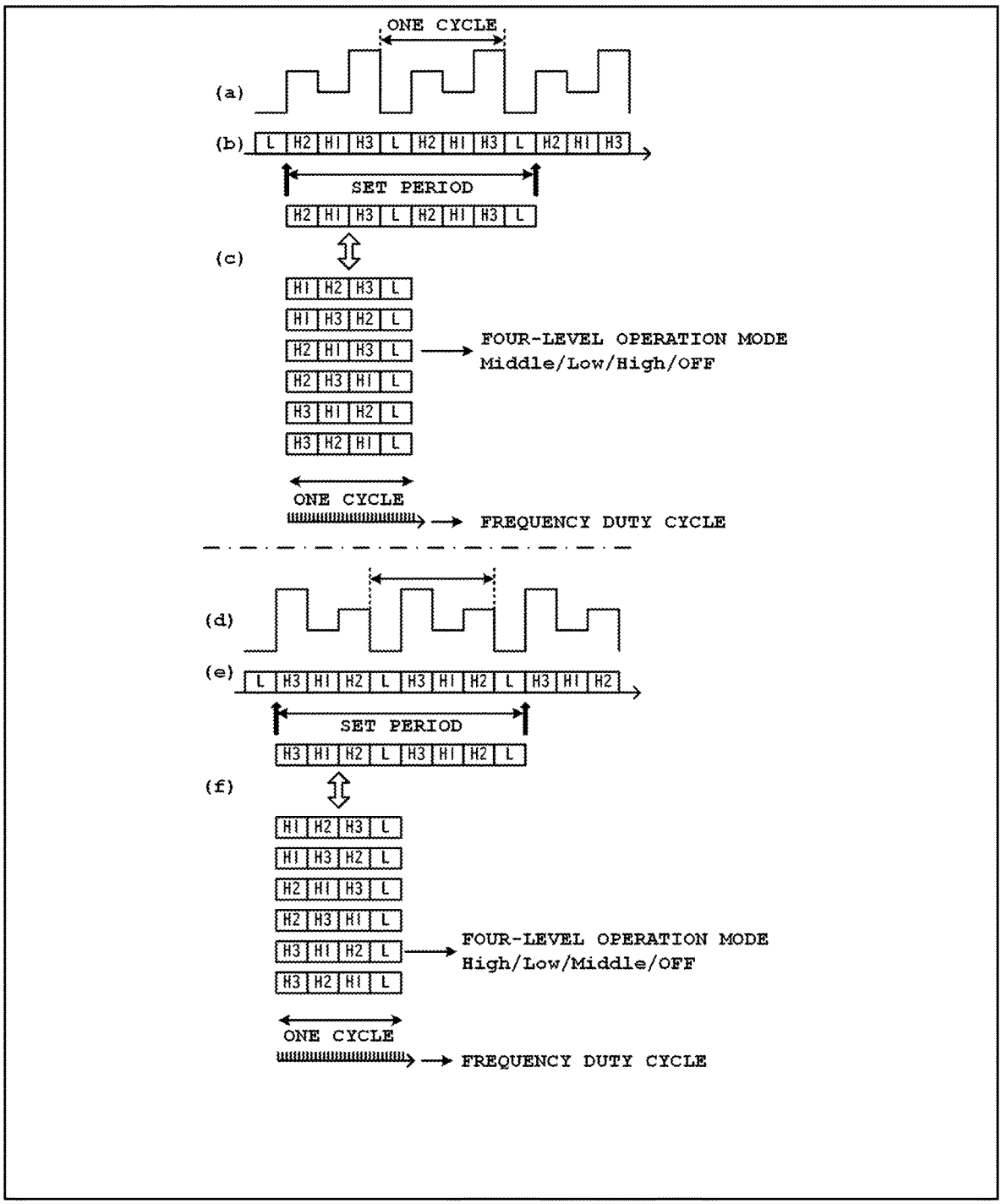
FIG. 21 illustrates the operation examples at four levels of the second configuration of the pulsed high frequency monitor according to the invention.
Figure 22:
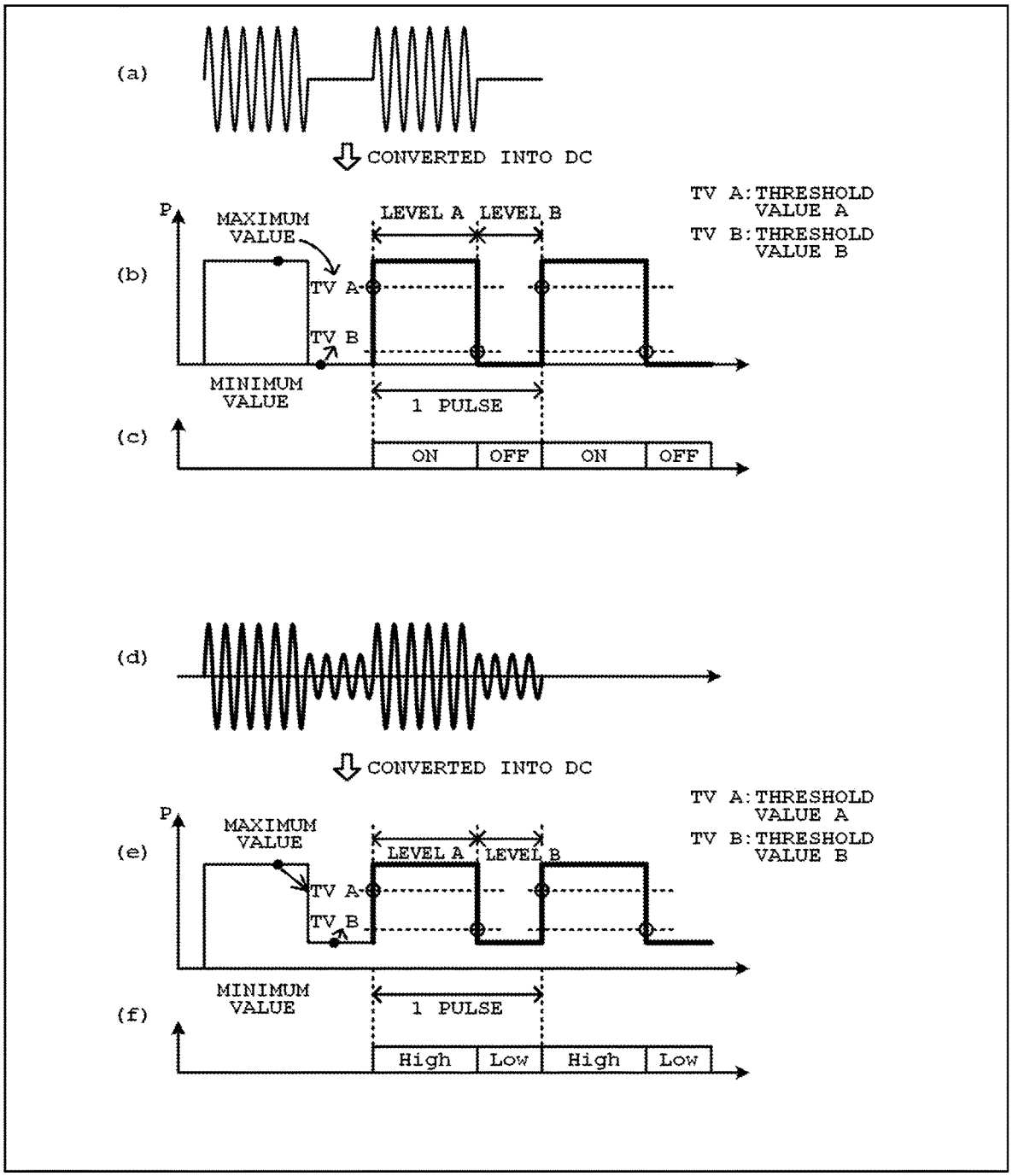
FIG. 22 shows an example of a typical pulsed high frequency.

FIGS. 19 to 21 show operation examples of extracting an operation mode from a transition level pattern at four levels. FIGS. 19(a) to 19(c) correspond to the transition level pattern in FIG. 18(a) and show examples of the transition level pattern at four levels, in which the power level increases in the sequence of the first High state, the second High state and the third High state and then decreases to the Low state or OFF state, and FIGS. 19(d) to 19(f) correspond to the transition level pattern in FIG. 18(b) and show examples of the transition level pattern at four levels, in which the power level increases from the Low state or OFF state and then decreases in the sequence of the third High state, the second High state and the first High state.

The examples of FIGS. 19(a) to 19(c) show that, in a rectangular wave signal obtained by converting a pulsed high frequency into a DC (FIG. 19(a)), voltage levels in the first High state, the second High state, the third High state, and the Low state or OFF state are compared to one another to thereby obtain a transition level pattern repeating (H1), (H2), (H3) and (L) (FIG. 19(b)). From the transition level pattern of consecutive (H1/H2/H3/L), a transition level pattern of a preset period is extracted and compared with the transition level pattern of four levels (H1/H2/H3/L).

The comparison enables an extraction of a four-level operation mode from a matched transition level pattern of four levels (H1/H2/H3/L) (FIG. 19(c)).

The examples of FIGS. 19(d) to 19(f) show that, in a rectangular wave signal obtained by converting a pulsed high frequency into a DC (FIG. 19(d)), voltage levels in the third High state, the second High state, the first High state, and the Low state or OFF state are compared to one another to thereby obtain a transition level pattern repeating (H3), (H2), (H1) and (L) (FIG. 19(e)). From the transition level pattern of consecutive (H3/H2/H1/L), a transition level pattern of a preset period is extracted and compared with the transition level pattern of four levels (H3/H2/H1/L). The comparison enables an extraction of a four-level operation mode from a matched transition level pattern of four levels (H3/H2/H1/L) (FIG. 19(f)).

Transition direction patterns in the examples of FIGS. 19(a) to 19(c) and transition direction patterns in the examples of FIGS. 19(d) to 19(f) are (UP/UP/UP/DOWN), and thus the transition patterns cannot be identified depending on the transition direction patterns. However, since the transition level patterns are different from each other, the transition patterns can be identified.

The examples of FIGS. 20(a) to 20(c) show that, in a rectangular wave signal obtained by converting a pulsed high frequency into a DC (FIG. 20(a)), voltage levels in the first High state, the third High state, the second High state, and the Low state or OFF state are compared to one another to thereby obtain a transition level pattern repeating (H1), (H3), (H2) and (L) (FIG. 20(b)). From the transition level pattern of consecutive (H1/H3/H2/L), a transition level pattern of a preset period is extracted and compared with the transition level pattern of four levels (H1/H3/H2/L). The comparison enables an extraction of a four-level operation mode from a matched transition level pattern of four levels (H1/H3/H2/L) (FIG. 20(c)).

The examples of FIGS. 20(d) to 20(f) show that, in a rectangular wave signal obtained by converting a pulsed high frequency into a DC (FIG. 20(d)), voltage levels in the second High state, the third High state, the first High state, and the Low state or OFF state are compared to one another to thereby obtain a transition level pattern repeating (H2), (H3), (H1) and (L) (FIG. 20(e)). From the transition level pattern of consecutive (H2/H3/H1/L), a transition level pattern of a preset period is extracted and compared with the transition level pattern of four levels (H2/H3/H1/L). The comparison enables an extraction of a four-level operation mode from a matched transition level pattern of four levels (H2/H3/H1/L) (FIG. 20(f)).

Transition direction patterns in the examples of FIGS. 20(a) to 20(c) and transition direction patterns in the examples of FIGS. 20(d) to 20(f) are (UP/UP/DOWN/DOWN), and thus the transition patterns cannot be identified depending on the transition direction patterns. However, since the transition level patterns are different from each other, the transition patterns can be identified.

The examples of FIGS. 21(a) to 21(c) show that, in a rectangular wave signal obtained by converting a pulsed high frequency into a DC (FIG. 21(a)), voltage levels in the second High state, the first High state, the third High state, and the Low state or OFF state are compared to one another to thereby obtain a transition level pattern repeating (H2), (H1), (H3) and (L) (FIG. 21(b)). From the transition level pattern of consecutive (H2/H1/H3/L), a transition level pattern of a preset period is extracted and compared with the transition level pattern of four levels (H2/H1/H3/L). The comparison enables an extraction of a four-level operation mode from a matched transition level pattern of four levels (H2/H1/H3/L) (FIG. 21(c)).

The examples of FIGS. 21(d) to 21(f) show that, in a rectangular wave signal obtained by converting a pulsed high frequency into a DC (FIG. 21(d)), voltage levels in the third High state, the first High state, the second High state, and the Low state or OFF state are compared to one another to thereby obtain a transition level pattern repeating (H3), (H1), (H2) and (L) (FIG. 21(e)). From the transition level pattern of consecutive (H3/H1/H2/L), a transition level pattern of a preset period is extracted and compared with the transition level pattern of four levels (H3/H1/H2/L). The comparison enables an extraction of a four-level operation mode from a matched transition level pattern of four levels (H3/H1/H2/L) (FIG. 21(f)).

The transition direction patterns in the examples of FIGS. 21(a) to 21(c) and the transition direction patterns in the examples of FIGS. 21(d) to 21(f) are (UP/DOWN/UP/DOWN), and thus the transition patterns cannot be identified depending on the transition direction patterns. However, since the transition level patterns are different from each other, the transition patterns can be identified.

Table 7 shows a relationship between power level transition in the previous cycle of the four-level operation mode and the operation mode.

TABLE 7

| Power Level Transition in Previous Cycle | | | | Operation Mode |
|---|---|---|---|---|
| No. 1 | No. 2 | No. 3 | No. 4 | Determination |
| High1 | High2 | High3 | Low | Four Levels (First High/Second High/Third High/Low) |
| High3 | High2 | High1 | Low | Four Levels (Third High/Second High/First High/Low) |
| High1 | High3 | High2 | Low | Four Levels (First High/Third High/Second High/Low) |
| High2 | High3 | High1 | Low | Four Levels (Second High/Third High/First High/Low) |
| High2 | High1 | High3 | Low | Four Levels (Second High/First High/Third High/Low) |
| High3 | High1 | High2 | Low | Four Levels (Third High/First High/Second High/Low) |

The operation examples are not limited to the above-described two levels, three levels and four levels, and thus operation examples at five or more power levels can also determine an operation mode from the power level transition.

The above embodiments and modifications are a few examples of the pulsed high frequency monitor of the present invention, and thus the present invention is not limited thereto. Accordingly, the present invention can be modified in various ways based on the gist of the invention, which modifications are not excluded from the scope of the present invention.

INDUSTRIAL APPLICABILITY

The pulsed high frequency monitor of the present invention can be applied as power source for supplying electric power to a plasma generation device, and further for monitoring a pulsed high frequency output by a power supply device that supplies a pulse output to, for instance, a load for exciting a pulse laser, or of an electric discharge machine.

REFERENCE SIGNS LIST

1 DC Conversion Circuit
2 Power Level Change Detection Circuit
2a Noise Removing Circuit
3 Transition Pattern Determination Circuit
3A Transition Pattern Determination Circuit
3Aa Transition Direction Detection Circuit
3Ab Transition Direction Time-Series Memory Circuit
3Ac Transition Direction Pattern Determination Circuit
3Ac1 Comparison Circuit
3Ac2 Transition Direction Pattern for Transition Pattern Determination
3Ad Operation Mode Encoder
3B Transition Pattern Determination Circuit
3Ba Transition Level Detection Circuit
3Bb Transition Level Time-Series Memory Circuit
3Bc Power Level Transition Pattern Determination Circuit
3Bc1 Comparison Circuit
3Bc2 Transition Level Pattern for Transition Pattern Determination
3Bc3 Period Pattern Determination Circuit
3Bd Operation Mode Encoder
4 Frequency Characteristics Detection Circuit
4a Period Detection Circuit
4b Time Measuring Circuit
4c Frequency Detection Circuit
4d Duty Cycle Detection Circuit
10 Pulsed High Frequency Monitor
10A Pulsed High Frequency Monitor
10B Pulsed High Frequency Monitor
20 High-Frequency Power Source
21 Sampling Circuit
22 Power Level Fluctuation Detection Circuit
23 First Power Level Change Direction Detection Circuit
24 First Noise Removing Circuit
25 Second Power Level Change Direction Detection Circuit
26 Power Level Transition Determination Circuit (Second Noise Removing Circuit)

The invention claimed is:
1. A pulsed high frequency monitor, comprising:
a DC conversion circuit that converts a pulsed high frequency into a DC to output a power level;
a power level change detection circuit that detects a level change in the power level; and
a transition pattern determination circuit that determines a transition pattern of the power level in a time series on a basis of the level change detected by the power level change detection circuit,
wherein the transition pattern is a time-series pattern in a transition direction of the power level or a time-series pattern of a transition level of the power level.

2. The pulsed high frequency monitor according to claim 1, further comprising a frequency characteristics detection circuit that detects frequency characteristics of the pulsed high frequency, wherein
the frequency characteristics detection circuit measures a time width of the level change detected by the power level change detection circuit to detect a frequency of a pulse period of the pulsed high frequency and a duty cycle in each pulse period of the pulsed high frequency.

3. The pulsed high frequency monitor according to claim 1, wherein the power level change detection circuit comprises a noise removing circuit, wherein
the noise removing circuit removes level changes consecutively detected in a predetermined detection time by the power level change detection circuit as noise from the power level changes.

4. The pulsed high frequency monitor according to claim 1, wherein the power level change detection circuit comprises a noise removing circuit, wherein
the noise removing circuit removes level changes, in which a power level detected by the power level change detection circuit does not continue in a predetermined time, as noise from the power level changes.

5. The pulsed high frequency monitor according to claim 1, wherein
the transition pattern determination circuit comprises:
a transition direction detection circuit that detects a transition direction of a power level; and
a transition direction pattern determination circuit that compares a time-series pattern in the transition direction of the power level detected by the transition direction detection circuit with a transition direction pattern for transition pattern determination.

6. The pulsed high frequency monitor according to claim 5, further comprising a frequency characteristics detection circuit that detects frequency characteristics of a pulsed high frequency, wherein
the frequency characteristics detection circuit comprises a period detection circuit that detects a pulse period of the pulsed high frequency,
the period detection circuit detecting a pulse period based on a time width between edges of the time-series pattern in the transition direction of the power level detected by the transition direction detection circuit.

7. The pulsed high frequency monitor according to claim 1, wherein
the transition pattern determination circuit comprises:
a transition level detection circuit that detects a transition level of a power level; and
a transition level pattern determination circuit that compares a time-series pattern of the transition level of the power level detected by the transition level detection circuit with a transition level pattern for transition pattern determination.

8. The pulsed high frequency monitor according to claim 7, further comprising a frequency characteristics detection circuit that detects frequency characteristics of a pulsed high frequency, wherein the frequency characteristics detection circuit comprises a period detection circuit that detects a pulse period of a pulsed high frequency, the period detection circuit detecting a pulse period based on a period pattern in a transition level time-series detected by the transition level pattern determination circuit.

\* \* \* \* \*